US008338080B2

United States Patent
Kozawa et al.

(10) Patent No.: US 8,338,080 B2
(45) Date of Patent: *Dec. 25, 2012

(54) PROCESS FOR FORMING RESIST PATTERN, SEMICONDUCTOR DEVICE AND FABRICATION THEREOF

(75) Inventors: Miwa Kozawa, Kanagawa (JP); Koji Nozaki, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 758 days.

This patent is subject to a terminal disclaimer.

(21) Appl. No.: 10/720,097

(22) Filed: Nov. 25, 2003

(65) Prior Publication Data

US 2004/0110099 A1 Jun. 10, 2004

(30) Foreign Application Priority Data

Dec. 9, 2002 (JP) ................................. 2002-356506

(51) Int. Cl.
*G03F 7/11* (2006.01)
(52) U.S. Cl. ..................... 430/273.1; 430/311; 430/313; 430/330
(58) Field of Classification Search ............... 430/273.1, 430/311, 313, 330
See application file for complete search history.

(56) References Cited

U.S. PATENT DOCUMENTS

| 3,912,450 | A | * | 10/1975 | Boucher | 422/20 |
| 5,173,393 | A | * | 12/1992 | Sezi et al. | 430/323 |
| 5,326,675 | A | * | 7/1994 | Niki et al. | 430/326 |
| 5,981,147 | A | * | 11/1999 | Hallock et al. | 430/281.1 |
| 7,592,127 | B2 | * | 9/2009 | Nozaki et al. | 430/273.1 |

FOREIGN PATENT DOCUMENTS

| EP | 1152036 A1 * | 11/2001 |
| JP | 5-197151 | 8/1993 |
| JP | 10-73927 | 3/1998 |
| JP | 2000-347414 | 12/2000 |
| JP | 2001-228616 | 8/2001 |
| JP | 2002-6491 | 1/2002 |
| JP | 2002-49161 | 2/2002 |

* cited by examiner

*Primary Examiner* — Daborah Chacko Davis
(74) *Attorney, Agent, or Firm* — Westerman, Hattori, Daniels & Adrian, LLP

(57) ABSTRACT

To thicken a resist pattern to be thickened to thereby easily form a fine pattern exceeding an exposure limit of optical source of conventional exposure devices, a process forms a resist pattern to be thickened by patterning a resist on an underlying object; applying a surfactant composition containing at least a surfactant on the resist pattern to be thickened; and applying a resist pattern thickening material containing at least a resin and a surfactant thereonto. The resist pattern to be thickened is thus thickened to form a fine pattern having a narrowed pitch.

18 Claims, 15 Drawing Sheets

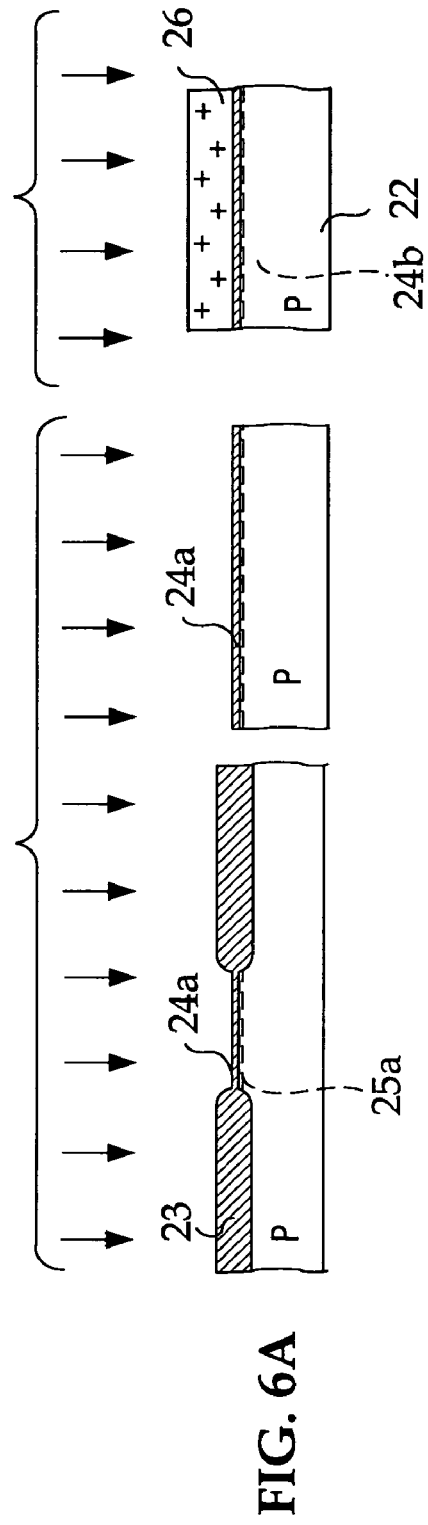
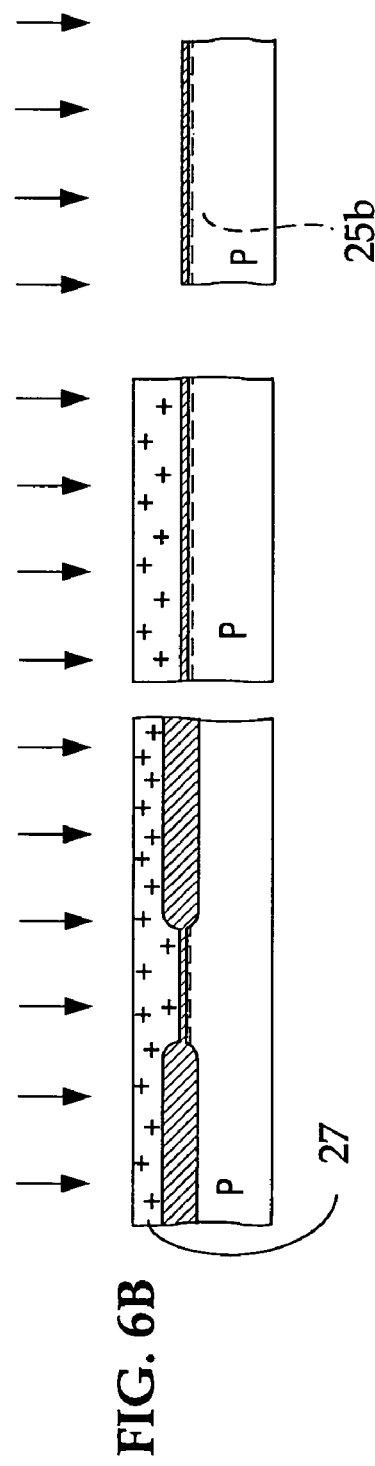
FIG. 6A  FIG. 6B  FIG. 6C

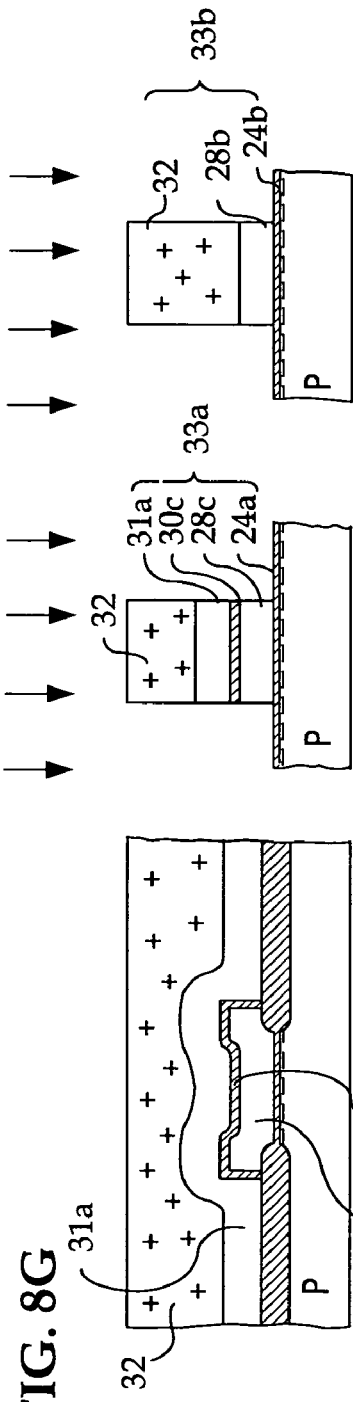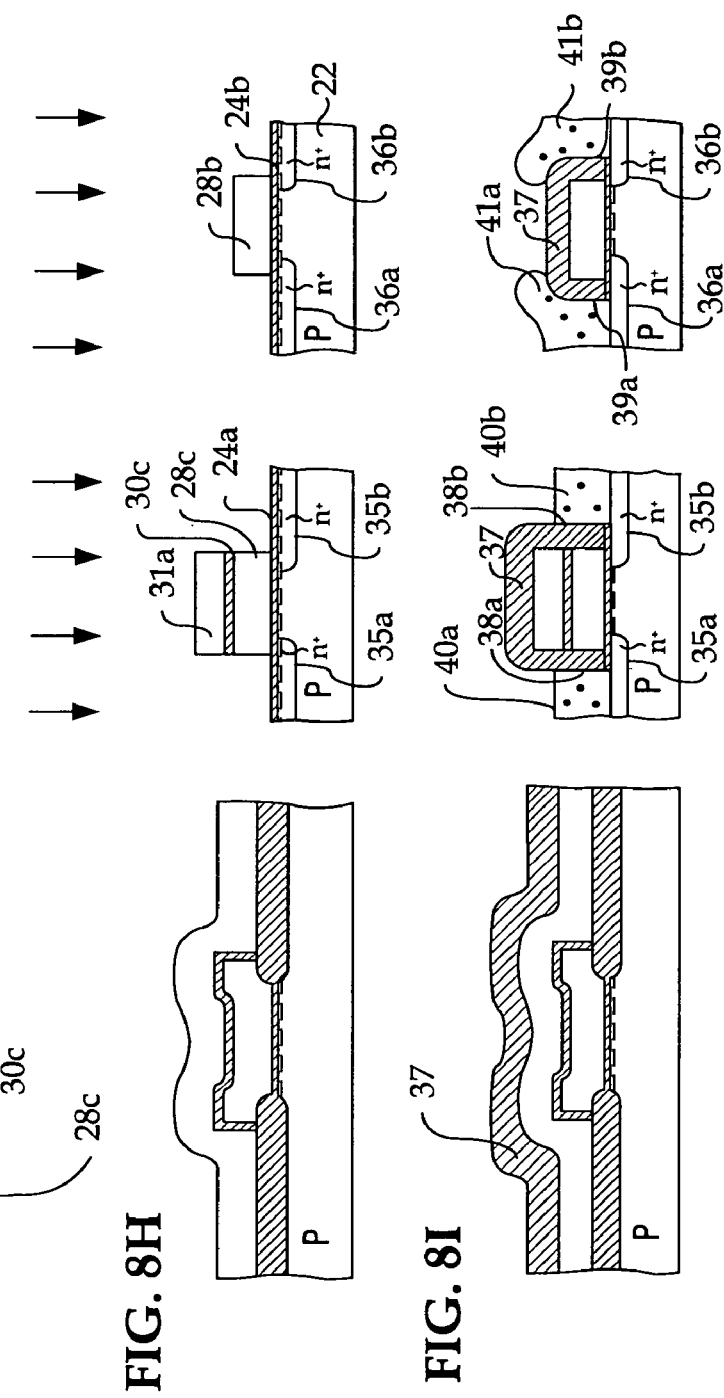
FIG. 8G
FIG. 8H
FIG. 8I

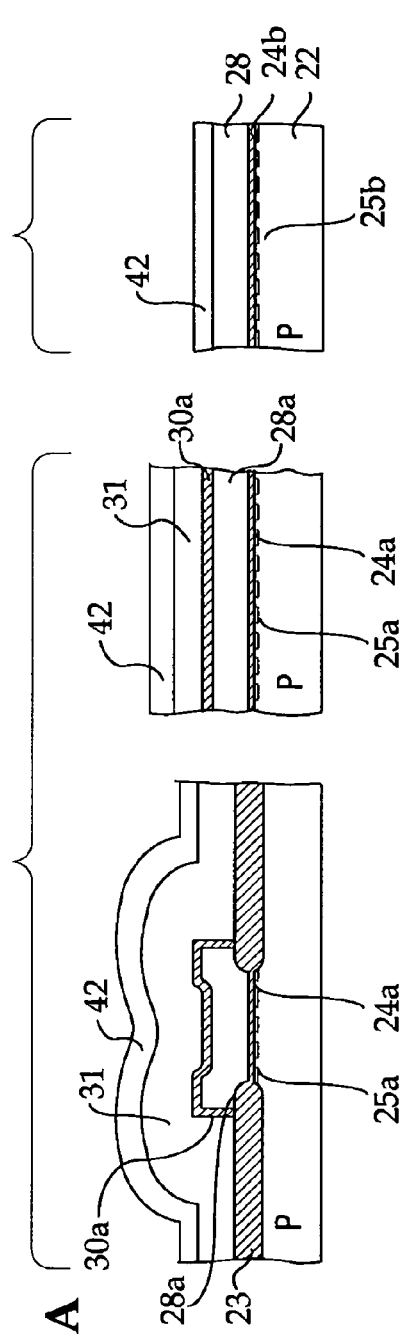
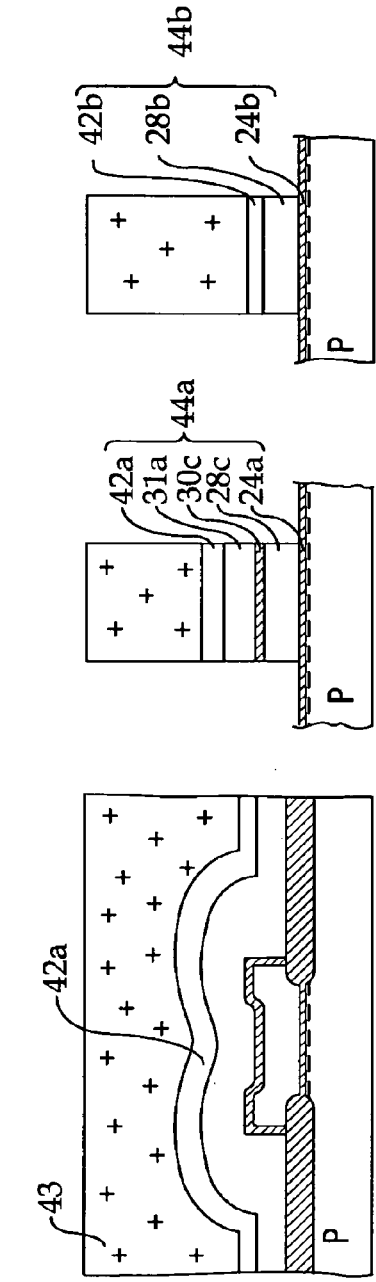
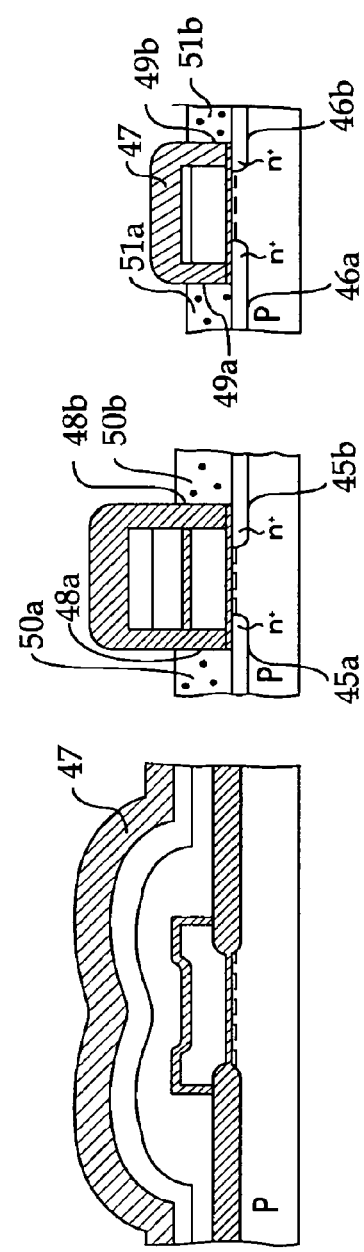
FIG. 9A
FIG. 9B
FIG. 9C

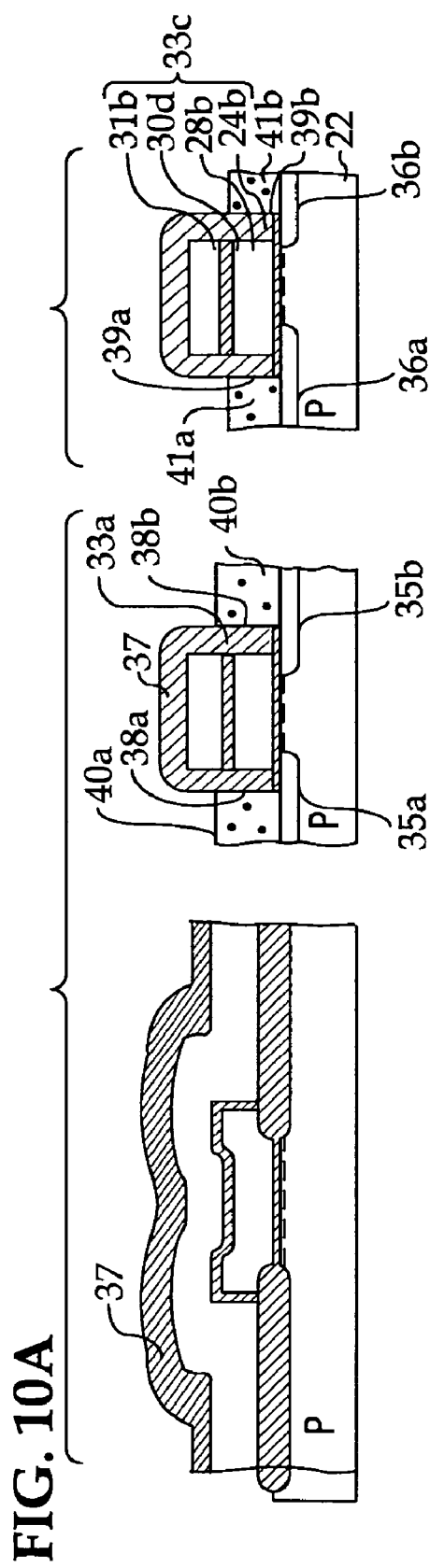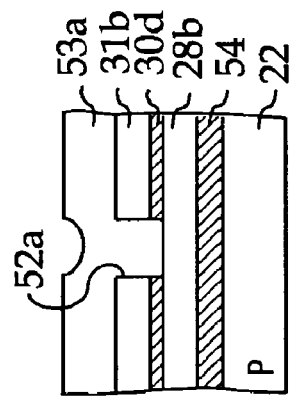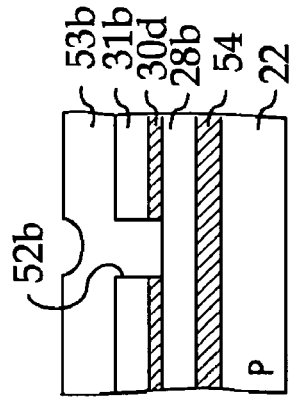
FIG. 10A
FIG. 10B
FIG. 10C

PROCESS FOR FORMING RESIST PATTERN, SEMICONDUCTOR DEVICE AND FABRICATION THEREOF

CROSS-REFERENCE TO RELATED APPLICATIONS

This application is based upon and claims the benefits of the priority from the prior Japanese Patent Application No. 2002-356506, filed in Dec. 9, 2002, the entire contents of which are incorporated herein by reference.

BACKGROUND OF THE INVENTION

1. Field of the Invention

The present invention relates to a process for forming a resist pattern by thickening a resist pattern formed of, for example, an ArF resist to thereby easily form a fine resist space pattern (a resist pattern having a narrowed pitch) exceeding exposure limit of optical source of conventional exposure devices; a high-performance semiconductor device having a fine resist space pattern formed by using the resist pattern having a narrowed pitch which is formed by the above process; and an efficient process for fabricating the semiconductor device.

2. Description of the Related Art

With increasing packing densities of semiconductor integrated circuits, LSI and VLSI have been in practical use. A wiring pattern now reaches the range of less than 0.2 μm, and the minimum dimension is 0.1 μm or less. In order to form a fine wiring pattern, it is very important to take advantage of lithography. The lithography comprises the steps of applying a resist film to a substrate having a thin film(s), selectively exposing the resist film to light and developing the exposed resist film to form a resist pattern, dry-etching the thin film(s) by using the resist pattern as a mask, and removing the resist pattern to yield a desired pattern.

In order to form a fine wiring pattern, it is necessary both to shorten a wavelength of an optical source of an exposure device, and to develop a resist material which has a high resolution based upon properties of the optical source. However, in order to shorten the wavelength of the optical source of an exposure device, the exposure device must be renewed, which results in considerable expenses. Developing a resist material which suits an exposure with a shorter wavelength is not very easy.

A process of fabricating a semiconductor device includes forming a resist pattern having a fine opening, and then finely patterning a target article using the fine resist pattern as a mask. Therefore, the resist pattern should be preferably excellent in etching resistance. However, in the newest technique, an argon fluoride (ArF) excimer laser exposure, a resist pattern used for the exposure is insufficient in etching resistance. Demands have been made on techniques to form a resist pattern excellent in etching resistance, and to form a fine resist space pattern by using the resist pattern.

A technique called RELACS is described in Japanese Patent Application Laid-Open (JP-A) No. 10-73927, in which a fine space pattern can be formed by use of KrF excimer laser light (wavelength: 248 nm), deep ultraviolet radiation, as the exposure light for a resist. This technique comprises patterning a resist by exposing the resist (positive type or negative type) to the KrF excimer laser light (wavelength: 248 nm) as the exposure light, forming a film by use of a water-soluble resin composition so as to cover the resist pattern, making the film interact with the resist pattern at the interface by action of a residual acid in the material of the resist pattern to thicken (hereinafter often referred also to as "swell") the resist pattern, thereby shortening the pitch between resist patterns to form the fine resist space pattern (pattern having a fine opening).

However, the KrF resist used in the technique is an aromatic resin composition such as a polyvinyl phenol resin. An aromatic ring contained in the aromatic resin composition highly absorbs the ArF excimer laser light. Therefore, the ArF excimer laser light cannot be used as the exposure light.

From the viewpoint of forming a fine wiring pattern, the ArF excimer laser light having a shorter wavelength than KrF excimer laser light should be preferably usable as an optical source in patterning.

However, a technique to form a fine pattern excellent in etching resistance easily with low cost, by using the ArF excimer laser light as an optical source of an exposure device in patterning has not yet been provided.

Objects and Advantages

Accordingly, an object of the present invention is to provide a process for thickening a resist pattern formed of, for example, an ArF resist to easily form a fine resist space pattern exceeding exposure limit of optical source of an exposure device; a high-performance semiconductor device having a fine pattern formed by the fine resist space pattern which is formed by the above process; and an efficient process for fabricating the semiconductor device.

SUMMARY OF THE INVENTION

Specifically, the present invention provides a process for forming a resist pattern to be thickened, including the steps of patterning a resist on an underlying object; applying a surfactant composition containing at least a first surfactant on the resist pattern to be thickened; and applying a resist pattern thickening material containing at least a resin and a second surfactant on the resist pattern to be thickened. When the surfactant composition is applied to the resist pattern to be thickened, the first surfactant contained in the surfactant composition penetrates the resist pattern to be thickened to thereby improve the affinity of a surface of the resist pattern to be thickened for the resist pattern thickening material. Then, the resist pattern thickening material is applied thereonto, and a portion of the applied resist pattern thickening material present near the interface with the resist pattern to be thickened very easily penetrates the resist pattern to be thickened and is then mixed with the material of the resist pattern to be thickened to form a mixed layer. In this procedure, the surface of the resist pattern to be thickened has a satisfactorily improved affinity for the resist pattern thickening material, and the resist pattern thickening material uniformly and easily penetrates to form the mixed layer easily. Therefore, a surface layer (the mixed layer), where the resist pattern thickening material is integrated into (mixed with) the resist pattern to be thickened, is efficiently formed on a surface of the resist pattern to be thickened. In other words, the resist pattern to be thickened is efficiently thickened by the resist pattern thickening material. As a resist pattern formed in such way is already thickened by the resist pattern thickening material, a resist space pattern formed by the resist pattern has a finer structure, exceeding an exposure limit.

The present invention further provides a process for fabricating a semiconductor device, including the steps of thickening a resist pattern to be thickened on an underlying object to form a resist pattern having a narrowed pitch by the process of forming a resist pattern of the present invention; and patterning the underlying object by performing an etching using the resist pattern having a narrowed pitch as a mask. According to this process, a resist pattern to be thickened is formed on an underlying object, a surfactant composition containing at least a first surfactant is applied on the resist pattern to be thickened, and a resist pattern thickening material containing at least a resin and a second surfactant is applied thereonto. The first surfactant contained in the surfactant composition penetrates the resist pattern to be thickened to thereby improve the affinity of a surface of the resist pattern to be thickened for the resist pattern thickening material. Then, the resist pattern thickening material is applied thereonto, and a portion of the applied resist pattern thickening material present near the interface with the resist pattern to be thickened very easily penetrates the resist pattern to be thickened and is then mixed with the material of the resist pattern to be thickened to form a mixed layer. In this procedure, the surface of the resist pattern to be thickened has a satisfactorily improved affinity for the resist pattern thickening material, and the resist pattern thickening material uniformly and easily penetrates to form the mixed layer easily. Therefore, a surface layer (the mixed layer), where the resist pattern thickening material is integrated into (mixed with) the resist pattern to be thickened, is efficiently formed on a surface of the resist pattern to be thickened. In other words, the resist pattern to be thickened is efficiently thickened by the resist pattern thickening material. As a resist pattern formed in such way is already thickened by the resist pattern thickening material and has a narrowed pitch, a pattern width formed by the resist pattern is reduced (is more finely patterned). A pattern formed by the resist pattern having a narrowed pitch has a finer structure, exceeding an exposure limit. Then, an etching is performed using the fine resist space pattern as a mask, the underlying object is finely patterned to thereby efficiently fabricate a high-performance semiconductor device having a very fine pattern.

A semiconductor device of the present invention is fabricated by the process for fabricating a semiconductor device of the present invention. The semiconductor device has a fine wiring pattern, exhibits high performance and is usable in various applications.

BRIEF DESCRIPTION OF THE DRAWINGS

FIGS. 6A, 6B, 6C, 7D, 7E, 7F, 8G, 8H, and 8I are schematic sectional views showing a process for fabricating a flash EPROM as an example of the present invention.

FIGS. 9A, 9B, and 9C are schematic sectional views showing a process for fabricating a flash EPROM as another example of the present invention.

FIGS. 10A, 10B, and 10C are schematic sectional views showing a process for fabricating a flash EPROM as still another example of the present invention.

DESCRIPTION OF THE PREFERRED EMBODIMENTS

Process for Forming Resist Pattern

Figure 1A:
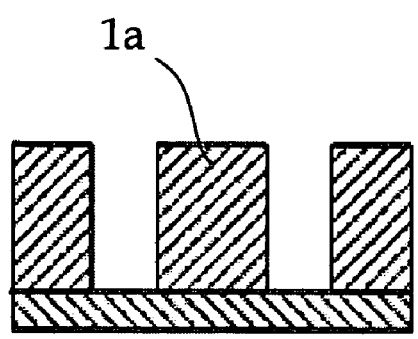
FIGS. 1A, 1B, 1C, 1D, 1E, and 1F are schematic diagrams showing an example of a mechanism of thickening a resist pattern to be thickened in the process for forming a resist pattern of the present invention.

According to the process for forming a resist pattern of the present invention, a resist pattern to be thickened is formed on an underlying object, a surfactant composition containing at least a first surfactant is applied on the resist pattern to be thickened, and a resist pattern thickening material containing at least a resin and a second surfactant is then applied thereonto. The process may further comprise other steps or processes, as long as not adversely affecting the advantages of the present invention.

Surfactant Composition

The surfactant composition contains at least one surfactant (first surfactant) and may further comprise a solvent and other components according to necessity.

First Surfactant

The first surfactant is not specifically limited, may be selected according to the purpose and includes, for example, nonionic surfactants, cationic surfactants, anionic surfactants, amphoteric surfactants, and silicone surfactants.

The nonionic surfactants are not specifically limited and may be selected according to the purpose. Preferred examples are alkoxylate surfactants, fatty acid ester surfactants, amide surfactants, alcohol surfactants, and ethylene diamine surfactants. Specific examples of these surfactants are polyoxyethylene-polyoxypropylene condensates, polyoxyalkylene alkyl ethers, polyoxyethylene alkyl ethers, polyoxyethylene derivatives, sorbitan fatty acid esters, glycerol fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, naturally occurring alcohols, ethylene diamines, and secondary alcohol ethoxylates.

The cationic surfactants are not specifically limited, may be selected according to the purpose and include, for example, alkyl cationic surfactants, amide quaternary cationic surfactants, and ester quaternary cationic surfactants.

The amphoteric surfactants are not specifically limited, may be selected according to the purpose and include, for example, amine oxide surfactants and betaine surfactants.

Each of these surfactants can be used alone or in combination. Among them, metal-free surfactants containing no metal ion are preferred, of which metal-free nonionic surfactants are typically preferred.

A surfactant having a high affinity for the resist pattern to be thickened is preferably used as the first surfactant.

The use of a surfactant having high affinity for the resist pattern to be thickened enables the resist pattern thickening material to efficiently penetrate the surface of the resist pattern to be thickened, even if the resist pattern thickening material directly applied does not penetrate the surface of the resist pattern to be thickened sufficiently and does not work to thicken the resist pattern to be thickened, i.e., even if the second surfactant in the resist pattern thickening material has insufficient capability of penetrating (mixing with) the resist pattern to be thickened, although it has high capability of dissolving the resin component of the resist pattern thickening material therein. Namely, by applying the surfactant composition containing a surfactant having high capability of penetrating (mixing with) the surface of the resist pattern to be thickened, the surfactant composition efficiently penetrates the surface of the resist pattern to be thickened. The surface of the resist pattern to be thickened thereby has an improved affinity for the resist pattern thickening material. Then, the resist pattern thickening material is applied onto the resist pattern of the resist pattern to be thickened and efficiently and easily penetrates the surface which has an improved affinity for the resist pattern thickening material to thereby efficiently thicken the resist pattern to be thickened. According to the present invention, the first surfactant in the surfactant composition serves, for example, as a mixing promoting agent, and the second surfactant in the resist pattern thickening material serves, for example, as a solvent for the resin component thereof. By dividing functions between two surfactants contained in different compositions and applying the compositions sequentially and separately to the resist pattern to be thickened, the resist pattern to be thickened can be efficiently thickened to yield a fine resist pattern having a narrowed pitch.

A suitable content of the first surfactant in the surfactant composition varies depending on, for example, the material of the resist and the composition of the resist pattern thickening material and may be set according to the purpose.

Solvent

The solvent is not specifically limited, and may be selected according to the purpose, but preferred examples are solvents that do not substantially dissolve the resist pattern to be thickened therein, of which water is typically preferred. Each of these solvents can be used alone or in combination.

A suitable content of the solvent in the surfactant composition varies depending on, for example, the material of the resist pattern to be thickened and the composition of the resist pattern thickening material and may be set according to the purpose.

Application and the Like

The application procedure for the surfactant composition is not specifically limited, as long as it allows the surfactant composition to cover the surface of the resist pattern to be thickened, and can be selected from among known coating or application procedures according to the purpose. Among them, spin coating is preferred. Spin coating is performed, for example, at about 100 rpm to 10000 rpm, preferably about 800 rpm to 5000 rpm, for about 1 second to about 10 minutes, preferably 1 second to 90 seconds.

The thickness of the applied surfactant composition is not specifically limited and may be selected according to the purpose.

The number of the application procedure is not specifically limited and may be selected depending on the compositions of the surfactant composition and the resist pattern thickening material. The surfactant composition is generally applied once, but may be applied two or more times.

The resist pattern may be heated after the application of the surfactant composition.

The heating temperature is not specifically limited, may be selected according to the purpose and is preferably from about 70° C. to about 150° C., and more preferably from about 85° C. to about 120° C. in view of the boiling point of the solvent and the heat resistance (deformation resistance) of the resist pattern to be thickened.

The heating time is not specifically limited, may be selected according to the purpose and is preferably from about 30 seconds to about 3 minutes.

The heating procedure can be performed according to any procedure using, for example, a conventional heater.

Resist Pattern Thickening Material

The resist pattern thickening material is generally a water-soluble or alkali-soluble composition. It is generally in the form of an aqueous solution but may be in another liquid form such as a colloid or emulsion.

The resist pattern thickening material comprises at least a resin and a surfactant (second surfactant) and may further comprise, for example, a crosslinking agent, an organic solvent, a cyclic-structure-containing compound and other components. The resin may have a cyclic structure at least partially.

Resin

The resin is not specifically limited, may be selected according to the purpose and is preferably a water-soluble resin or an alkali-soluble resin. More preferably, it is a resin that can induce a crosslinking reaction or is miscible with a crosslinking agent.

Each of such resins can be used alone or in combination.

When the resin is a water-soluble resin, it is soluble in an amount of preferably 0.1 g or more, more preferably 0.3 g or more, and further preferably 0.5 g or more in 100 g of water at 25° C.

Examples of the water-soluble resin are poly(vinyl alcohol)s, poly(vinyl acetal)s, poly(vinyl acetate)s, poly(acrylic acid)s, polyvinylpyrrolidinones (polyvinylpyrrolidones), polyethyleneimines, poly(ethylene oxide)s, styrene-maleic acid copolymers, polyvinylamines, polyallylamines, oxazoline-containing water-soluble resins, water-soluble melamine resins, water-soluble urea resins, alkyd resins, and sulfonamide resins.

When the resin is an alkali-soluble resin, it is soluble in an amount of preferably 0.1 g or more, more preferably 0.3 g or more, and further preferably 0.5 g or more in 100 g of a 2.38% aqueous solution of tetramethylammonium hydroxide (TMAH) at 25° C.

Examples of the alkali-soluble resin are novolac resins, vinyl phenol resins, poly(acrylic acid)s, poly(methacrylic acid)s, poly(p-hydroxyphenyl acrylate)s, poly(p-hydroxyphenyl methacrylate)s, and copolymers of these constituting monomers.

Among these resins, preferred examples are poly(vinyl alcohol)s, poly(vinyl acetal)s, poly(vinyl acetate)s, poly(acrylic acid)s, and polyvinylpyrrolidinones, of which resins containing a poly(vinyl acetal) are more preferred. The resin especially preferably comprise 5% by weight to 40% by weight of a poly(vinyl acetal) for easy change in its solubility as a result of crosslinking.

The resin may have a cyclic structure at least partially. This type of resin can markedly improve the etching resistance of the thickened resist pattern as compared with that before thickening.

The cyclic structure is not specifically limited, may be selected according to the purpose and preferred examples are structures derived from at least one of aromatic compounds, alicyclic compounds and heterocyclic compounds.

Examples of the aromatic compounds are polyphenol compounds, aromatic carboxylic acid compounds, polyhydric naphthalene compounds, benzophenone compounds, flavonoid compounds, porphines, water-soluble phenoxy resins, aromatic-group-containing water-soluble dyes and pigments, derivatives and glycosides thereof. Each of these compounds can be used alone or in combination.

Examples of the polyphenol compounds and derivatives thereof are resorcinol, resorcinol [4]arenes, pyrogallol, gallic acid, catechin, anthocyanidines such as pelargonidin (4'-hydroxy), cyanidin (3',4'-dihydroxy), and delphinidin (3',4',5'-trihydroxy), flavan-3,4-diol, proanthocyanidin, and derivatives and glycosides of these compounds.

Examples of the aromatic carboxylic acid compounds and derivatives thereof are salicylic acid, phthalic acid, dihydroxybenzoic acid, tannin, and derivatives and glycosides thereof.

Examples of the polyhydric naphthalene compounds and derivatives thereof include naphthalenediols, naphthalenetriols, and derivatives and glycosides thereof.

Examples of the benzophenone compounds and derivative thereof include alizarin yellow A, and derivatives and glycosides thereof.

Examples of the flavonoid compounds and derivatives thereof include flavone, isoflavone, flavanols such as flavan-3-ol, flavonone, flavonol, aurone, chalcone, dihydrochalcone, quercetin, and derivatives and glycosides thereof.

Examples of the alicyclic compounds are polycycloalkanes, cycloalkanes, fused cyclic compounds, derivatives and glycosides thereof. Each of these compounds can be used alone or in combination.

Examples of the polycycloalkanes include norbornane, adamantane, norpinane, and sterane.

Examples of the cycloalkanes include cyclopentane and cyclohexane.

Examples of the fused cyclic compounds include steroids.

Examples of the heterocyclic compounds include nitrogen-containing cyclic compounds such as pyrrolidine, pyridine, imidazole, oxazole, morpholine, and pyrrolidone; oxygen-containing cyclic compounds such as furan, pyran, monosaccharides and polysaccharides including pentoses and hexoses.

Among the resins and those partially having a cyclic structure, resins having two or more polar groups are preferred for their higher solubility in at least one of water and alkali.

The polar groups are not particularly limited, and can be selected according to purposes. Suitable examples include a hydroxyl group, a cyano group, an alkoxy group, a carboxyl group, a carbonyl group, an amino group, an amide group, an alkoxycarbonyl group, a hydroxyalkyl group, a sulfonyl group, an acid anhydride group, a lactone group, a cyanate group, an isocyanate group, and a ketone group. Of those polar groups, more suitable examples include a hydroxyl group, a carboxyl group, a carbonyl group, an amino group, and a sulfonyl group.

When the resin at least partially has a cyclic structure, the rest of the resin moiety is not specifically limited, as long as the resin may be either water-soluble or alkali-soluble. Examples include water-soluble resins such as poly(vinyl alcohol)s, and poly(vinyl acetal)s; alkali-soluble resins such as novolac resins, and vinylphenol resins.

The molar content of the cyclic structure, if any, is not specifically limited and may be selected according to the purpose. If the resin requires high etching resistance, it is preferably 5 % by mole or more, and more preferably 10% by mole or more.

The molar content can be determined, for example, by NMR analysis.

A suitable content of the resin in the resist pattern thickening material varies depending on, for example, the composition of the surfactant composition and the material of the resist pattern and may be set according to the purpose.

Second Surfactant

The second surfactant is suitably used to improve the affinity of the resist pattern thickening material for the resist pattern to be thickened (for instance, a patterned ArF resist).

By using the second surfactant in the resist pattern thickening material, the resist pattern to be thickened can be efficiently thickened while having excellent in-plane uniformity to efficiently and uniformly form a fine pattern, and the foaming of the resist pattern thickening material can be also effectively suppressed.

The second surfactant is not specifically limited, may be selected according to the purpose and includes, for example, nonionic surfactants, cationic surfactants, anionic surfactants, amphoteric surfactants, and silicone surfactants. Each of these surfactants can be used alone or in combination. Among them, metal-free surfactants are preferred, of which metal-free nonionic surfactants are more preferred.

The nonionic surfactants are not specifically limited and may be selected according to the purpose. Examples are alkoxylate surfactants, fatty acid ester surfactants, amide surfactants, alcohol surfactants, and ethylenediamine surfactants. Specific examples of these surfactants are polyoxyethylene-polyoxypropylene condensates, polyoxyalkylene alkyl ethers, polyoxyethylene alkyl ethers, polyoxyethylene derivatives, sorbitan fatty acid esters, glycerol fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, naturally occurring alcohols, ethylenediamines, and secondary alcohol ethoxylates.

The cationic surfactants are not specifically limited, may be selected according to the purpose and include, for example, alkyl cationic surfactants, amide quaternary cationic surfactants, and ester quaternary cationic surfactants.

The amphoteric surfactants are not specifically limited, may be selected according to the purpose and include, for example, amine oxide surfactants and betaine surfactants.

A suitable content of the second surfactant in the resist pattern thickening material varies depending on, for example, the composition of the surfactant composition, and the types and contents of the materials of the resist pattern to be thickened and may be set according to the purpose.

The first and second surfactants may be the same with or different from each other.

Crosslinking Agent

The crosslinking agent is not specifically limited and may be selected according to the purpose. Those soluble in at least one of water and alkalis are preferred, and those that can induce a crosslinking reaction by action of heat or an acid are also preferred. Preferred examples of the crosslinking agent are amino-containing crosslinking agents.

Examples of the amino-containing crosslinking agents are urea derivatives, melamine derivatives and uril derivatives. Each of these can be used alone or in combination.

Examples of the urea derivatives are urea, alkoxymethylene urea, N-alkoxymethylene urea, ethylene urea, ethylene ureacarboxylic acid, and derivatives thereof.

Examples of the melamine derivatives are alkoxymethylmelamines, and derivatives thereof.

Examples of the uril derivatives are benzoguanamine, glycoluril, and derivatives thereof.

A suitable content of the crosslinking agent in the resist pattern thickening material varies depending on, for example, the composition of the surfactant composition, and the types and contents of the materials of the resist pattern to be thickened and may be selected according to the purpose.

Organic Solvent

The use of the organic solvent in the resist pattern thickening material can improve the solubility of the above resin, crosslinking agent, compound having a cyclic structure, and resin partially having a cyclic structure in the resist pattern thickening material.

The organic solvent is not specifically limited, may be selected according to the purpose and examples are alcohols, chain esters, cyclic esters, ketones, chain ethers, and cyclic ethers.

Examples of the alcohols are methanol, ethanol, propyl alcohol, isopropyl alcohol, and butyl alcohol.

Examples of the chain esters are ethyl lactate, and propylene glycol methyl ether acetate (PGMEA).

Examples of the cyclic esters are γ-butyrolactone and other lactones.

Examples of the ketones are acetone, cyclohexanone, heptanone, and other ketones.

Examples of the chain ethers include ethylene glycol dimethyl ether.

Examples of the cyclic ethers are tetrahydrofuran and dioxane.

Each of these organic solvents can be used alone or in combination. Among them, those having a boiling point of about 80° C. to 200° C. are preferred for more precise thickening of the resist pattern.

The content of the organic solvent in the resist pattern thickening material may be set depending on, for example, the types and contents of the resin, compound having a cyclic structure, crosslinking agent, and second surfactant.

Cyclic Structure-Containing Compound

The cyclic structure-containing compound is not specifically limited, as long as it contains the cyclic structure, and may be selected according to the purpose from among compounds and resins. The cyclic structure-containing compound is preferably water-soluble and/or alkali-soluble.

By using the cyclic structure-containing compound in the resist pattern thickening material, the resist pattern has markedly improved etching resistance as compared with that before thickening.

When the cyclic structure-containing compound is water-soluble, it is soluble in an amount of preferably 0.1 g or more, more preferably 0.3 g or more, and further preferably 0.5 g or more in 100 g of water at 25° C.

When the cyclic structure-containing compound is alkali-soluble, it is soluble in an amount of preferably 0.1 g or more, more preferably 0.3 g or more, and further preferably 0.5 g or more in 100 g of a 2.38% aqueous solution of tetramethylammonium hydroxide (TMAH) at 25° C.

Examples and concrete examples of the cyclic structure-containing compound are the aforementioned aromatic compounds, alicyclic compounds, heterocyclic compounds, and concrete examples thereof.

The cyclic structure-containing compound preferably has two or more polar groups, more preferably three or more polar groups, and further preferably four or more polar groups for better solubility in at least one of water and alkalis.

The polar groups are not particularly limited and may be selected according to purposes. Suitable examples include a hydroxyl group, a cyano group, an alkoxy group, a carboxyl group, a carbonyl group, an amino group, an amide group, an alkoxycarbonyl group, a hydroxyalkyl group, a sulfonyl group, an acid anhydride group, a lactone group, a cyanate group, an isocyanate group, and a ketone group. Of those polar groups, more suitable examples include a hydroxyl group, a carboxyl group, a carbonyl group, an amino group, and a sulfonyl group.

When the cyclic structure-containing compound is a resin, the molar content of the cyclic structure in the resin is not specifically limited and may be selected according to the purpose. If the resin requires high etching resistance, the molar content is preferably 5% by mole or more, and more preferably 10% by mole or more.

The molar content can be determined, for example, by NMR analysis.

The content of the cyclic structure-containing compound in the resist pattern thickening material can be set depending on, for example, the composition of the surfactant composition, the materials of the resist pattern to be thickened, and the types and contents of the resin, the cyclic structure-containing compound, the crosslinking agent, and the second surfactant.

Other Components

Other components are not specifically limited, as long as not adversely affecting the advantages of the present invention, may be selected according to the purpose and include conventional additives such as heat-induced acid generators, and quenchers including amines, amides, and ammonium salts.

The content of the other components in the resist pattern thickening material can be set depending on, for example, the types and contents of the resin, cyclic structure-containing compound, crosslinking agent, and second surfactant.

Application and Other Processes

The application procedure for the resist pattern thickening material is not specifically limited and can be selected from among known coating or application procedures according to the purpose, of which spin coating is preferred. The spin coating is performed, for example, at a number of revolutions of about 100 rpm to 10000 rpm, preferably at about 800 rpm to 5000 rpm, for about 1 second to about 10 minutes, preferably for 1 second to 90 seconds.

The thickness of the applied resist pattern thickening material is generally from about 10 nm (100 Å) to 1000 nm (10000 Å), and preferably from about 50 nm (500 Å) to 500 nm (5000 Å).

The applied resist pattern thickening material is preferably prebaked (heated and dried) during or after its application. The resulting resist pattern thickening material can more efficiently penetrate (be mixed with) the resist pattern to be thickened at the interface therebetween.

The conditions and procedures for the prebaking (heating and drying) are not specifically limited, as long as the resist pattern to be thickened is not softened, and may be set according to the purpose. For example, the prebaking is performed at a temperature of about 40° C. to about 120° C., and preferably about 70° C. to 100° C. for about 10 seconds to 5 minutes, and preferably about 40 seconds to 100 seconds.

The prebaked (heated and dried) resist pattern thickening material is preferably further baked for more efficient penetrating the resist pattern to be thickened with the resist pattern thickening material at the interface therebetween.

The conditions and procedures for the baking are not specifically limited and may be selected according to the purpose. The baking is generally performed at a temperature higher than that in the prebaking (heating and drying) within a range of, for example, from about 70° C. to about 150° C., and preferably from 90° C. to 130° C. for about 10 seconds to about 5 minutes, and preferably about 40 seconds to 100 seconds.

The resist pattern thickening material is preferably developed after the baking. The development can remove portions of the resist pattern thickening material not mixed with the resist pattern to be thickened to yield a thickened resist pattern (a fine resist pattern having a narrowed pitch).

The development is performed with water or an alkaline developer. Among them, development with water is preferred for efficient development at lower cost.

When the resist pattern thickening material is applied to the resist pattern to be thickened, the resist pattern to be thickened is thickened to form a resist pattern having a narrowed pitch. The surface of the resist pattern to be thickened has been penetrated with the surfactant composition and thereby has an improved affinity for the resist pattern thickening material. Accordingly, the resist pattern thickening material uniformly and easily penetrates the resist pattern to be thickened to thereby form the mixed layer easily. Therefore, a surface layer (the mixed layer), where the resist pattern thickening material is integrated into (mixed with) the resist pattern to be thickened, is efficiently formed on a surface of the resist pattern to be thickened. In other words, the resist pattern to be thickened is efficiently thickened by the resist pattern thickening material to form a resist pattern.

A pattern formed by the resist pattern has a smaller diameter or width (opening dimensions) than those of resist patterns formed by the resist pattern before thickening. Applying the resist pattern thickening material forms a finer pattern having a narrowed pitch, exceeding the exposure limit of an exposure device used for patterning the resist. For example, by using ArF excimer laser light, an obtained resist pattern is thickened by the process of the present invention, and then a fine resist pattern is formed. Thus, a pattern formed by the fine resist pattern has as fine pattern as one patterned by an electron beam.

The magnitude of thickening can be controlled within a desired range by appropriately controlling, for example, the type and amount of the first surfactant in the surfactant composition, the type and amount of the second surfactant, the viscosity, applied thickness, baking temperature, and baking time of the resist pattern thickening material.

Materials for Resist Pattern to be Thickened

Materials for the resist pattern to be thickened are not specifically limited and may be selected from among conventional resist materials according to the purpose. They may be of negative type or positive type and include, for example, g-line resists, i-line resists, KrF resists, ArF resists, $F_2$ resists, and electron beam resists which can be patterned with, for example, g-line, i-line, KrF excimer laser, ArF excimer laser, $F_2$ excimer laser, or electron beam. They can be chemically amplified resists or conventional non-chemically amplified resists. Among them, KrF resists and ArF resists are preferred, of which ArF resists are more preferred.

Specific examples of the materials for the resist are novolac resists, poly(p-hydroxystyrene) (PHS) resists, acrylic resists, cycloolefin-maleic anhydride (COMA) resists, cycloolefin resists, and hybrid (alicyclic acrylic-COMA copolymer) resists. These resists may be modified, for example, with fluorine.

The patterning procedure and dimensions of the resist pattern to be thickened are not specifically limited and may be selected according to the purpose. The thickness thereof can be set depending on the underlying object to be processed and etching conditions and is generally from about 0.2 μm to about 200 μm.

The resist can be formed on an underlying object (base or substrate). The underlying object is not specifically limited and may be selected according to the purpose. When the resist pattern to be thickened is formed in a semiconductor device, the underlying object is generally a semiconductor substrate such as silicon wafer or an oxide film.

The thickening of the resist pattern to be thickened in the process for forming a resist pattern of the present invention will be illustrated below with reference to the drawings.

Figure 1B:
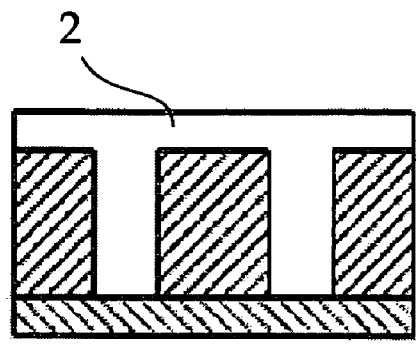
Figure 1C:
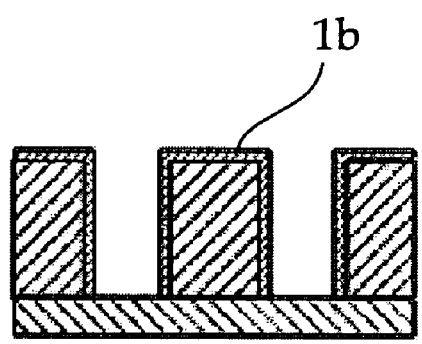
Figure 1D:
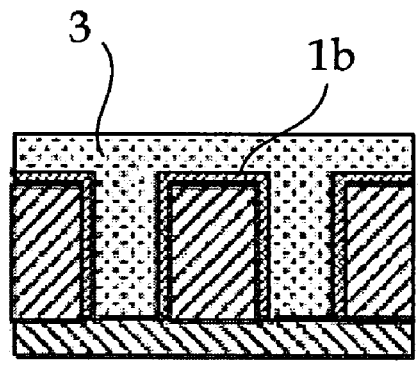
Figure 1E:
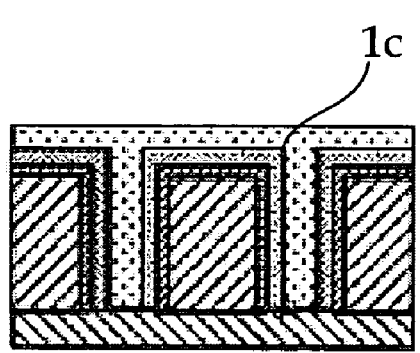
Figure 1F:
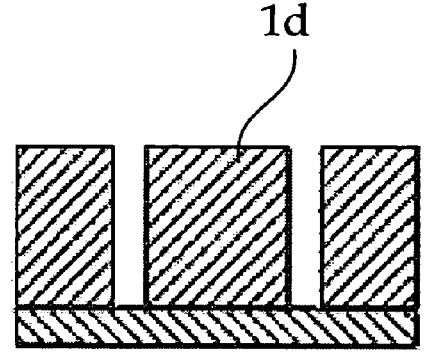

A resist pattern to be thickened 1a is formed on an underlying object (substrate) (FIG. 1A), and a surfactant composition 2 is applied onto the surface of the resist pattern to be thickened 1a (FIG. 1B). Next, the resulting article is heated according to necessity (FIG. 1C), and a resist pattern thickening material 3 is applied thereto (FIG. 1D). Thus, the resist pattern thickening material 3 penetrates (is mixed with) the resist pattern to be thickened 1a in the vicinity of the interface therebetween. The resulting article is then prebaked (heated and dried) to crosslink the mixing (penetrating) portion. Thus, a surface layer (mixed layer) 1c comprising a mixture of the resist pattern to be thickened 1a and the resist pattern thickening material 3 is formed at the surface of the resist pattern to be thickened 1a (FIG. 1E). The article is then subjected to development, as a result of which portions of the applied resist pattern thickening material 3 not mixed with the resist pattern to be thickened 1a are dissolved and removed to form (develop) a thickened resist pattern 1d (FIG. 1F).

The resist pattern 1d has the mixed layer (surface layer) 1c on the surface of the resist pattern to be thickened 1a, which mixed layer has been formed by mixing (penetrating) and crosslinking the resist pattern thickening material 3 on the surface of the resist pattern to be thickened 1a. The resist pattern 1d is thickened to the extent of the thickness portion of the surface layer 1c as compared with the resist pattern to be thickened 1a, and a pattern formed by the resist pattern 1d has a width smaller than that of a pattern formed by the resist pattern to be thickened 1a. This allows to form a finer pattern exceeding an exposure limit of an optical source of an exposure device. A pattern formed by the resist pattern 1d is finer than a pattern formed by the resist pattern to be thickened 1a.

The thickened resist pattern can be suitably used for functional parts such as mask pattern, reticle pattern, magnetic head, LCD (liquid crystal display), PDP (plasma display panel), and SAW filter (surface acoustic wave filter); optical parts used for connection of optical wiring; micro parts such as micro actuator; semiconductor devices, and suitably used for the semiconductor device and fabrication process thereof of the present invention described later.

Semiconductor Device and Fabrication Process Thereof

The process for fabricating a semiconductor device of the present invention comprises a step for forming a resist pattern and a step for patterning and may further comprise other steps according to necessity. The semiconductor device of the present invention can be fabricated by the above process.

The semiconductor device of the present invention will be illustrated in detail below, with reference to the illustration of the process for fabricating a semiconductor device.

The step for forming a resist pattern is a step for thickening a resist pattern to be thickened formed on an underlying object by the process for forming a resist pattern of the present invention.

Examples of the underlying object (base or substrate) are surface layers of various parts in a semiconductor device, of which semiconductor substrates such as silicon wafers or surface layers thereof are preferred. The resist pattern to be thickened and the application procedure thereof are the same as described above. After the application, the resulting article is preferably subjected to the prebaking and crosslinking-baking.

The step for patterning comprises patterning the underlying object (base or substrate) by performing an etching using the thickened resist pattern as a mask pattern formed in the step for forming the resist pattern.

The etching process is not particularly limited and may be selected according to the purpose, of which dry etching is preferred. The condition of the etching is not particularly limited and may be selected according to the purpose.

A suitable example of the other steps is a step for developing.

The developing step is a step for developing the applied resist pattern thickening material after the step for forming the resist pattern and prior to the step of patterning. The developing procedure is the same as described above.

The semiconductor device of the present invention fabricated by the above process has a fine wiring pattern, exhibits high performance and can be suitably used in various applications. Examples of the semiconductor device are flash memory, DRAM, and FRAM.

The present invention will be illustrated in further detail with reference to several examples below, which are never intended to limit the scope of the present invention.

EXAMPLE 1

Preparation of Surfactant Composition and Resist Pattern Thickening Material

Surfactant compositions A and B each having a composition shown in Table 1 and resist pattern thickening materials 1, 2 and 3 each having a composition shown in Table 2 were prepared.

In Table 1, numerals in parentheses are parts by mass. In the column of "Surfactant", "TN-80" represents a nonionic surfactant (a polyoxyethylene monoalkyl ether surfactant available from Asahi Denka Co., Ltd.) and "PC-6" represents a nonionic surfactant (a polyoxyethylene monoalkyl ether surfactant available from Asahi Denka Co., Ltd.). The "Water" in the column of "Solvent" is pure water (deionized water).

In Table 2, numerals in parentheses are parts by mass. In the column of "Resin", "KW-3" represents a poly(vinyl acetal) resin (available from Sekisui Chemical Co., Ltd.), and "Polyvinylpyrrolidinone" is one available from Kanto Kagaku Co., Ltd. In the column of "Crosslinking agent", "Uril" represents tetramethoxymethyl glycoluril. In the column of "Surfactant", "TN-80" represents a nonionic surfactant (a polyoxyethylene monoalkyl ether surfactant available from Asahi Denka Co., Ltd.) and "PC-6" represents a nonionic surfactant (a polyoxyethylene monoalkyl ether surfactant available from Asahi Denka Co., Ltd.). In the resist pattern thickening materials, a 98.6:0.4 by mass mixture of pure water (deionized water) and isopropyl alcohol was used as a main solvent other than the resin.

TABLE 1

| Surfactant composition | Surfactant | Solvent |
|---|---|---|
| A | TN-80 (0.5) | Water (99.5) |
| B | PC-6 (0.5) | Water (99.5) |

TABLE 2

| Resist pattern thickening material | Resin | Crosslinking agent | Surfactant |
|---|---|---|---|
| 1 | KW-3 (16) | Uril (1.00) | TN-80 (0.25) |
| 2 | KW-3 (16) | Uril (1.00) | PC-6 (0.25) |
| 3 | Polyvinylpyrrolidinone (8) | Uril (1.00) | TN-80 (0.25) |

Formation of Resist Pattern

Each of the above-prepared surfactant compositions was applied onto a resist pattern to be thickened formed from an alicyclic ArF resist PAR 700 (trade name, available from Sumitomo Chemical Co., Ltd.) by spin coating at 3500 rpm for 40 seconds and was then baked at 100° C. for 60 seconds.

Next, each the above-prepared resist pattern thickening materials was applied thereonto by spin coating at 3500 rpm for 40 seconds, was baked at 85° C. for 70 seconds and then at 110° C. for 70 seconds. The resist pattern thickening material was rinsed with pure water for 60 seconds to remove portions not mixed (not penetrated) to thereby develop a resist pattern thickened by the resist pattern thickening material. Thus, the thickened resist pattern, i.e., a fine resist pattern, was formed by the process of the present invention.

EXAMPLE 2

Each of the surfactant compositions and resist pattern thickening materials was applied, by the procedure of Example 1, to a hole pattern having a hole size of 200 nm formed by an alicyclic ArF resist. Then, the hole-patterned resist (resist space pattern) was thickened by the procedure of Example 1 by the process of the present invention to yield a thickened resist pattern having a narrowed pitch. The pattern sizes (nm) of the formed resist patterns are shown in Table 3.

TABLE 3

| Resist pattern thickening material | Surfactant composition | | |
|---|---|---|---|
| | none | A | B |
| 1 | 150.8 | 140.4 | 131.9 |
| 2 | 146.8 | 136.4 | 133.0 |
| 3 | 156.7 | 140.4 | 135.9 |

Separately, the hole-patterned resist was thickened using the resist pattern thickening material 1 by the procedure of Example 1, except that baking was not performed after the application of the surfactant composition. The pattern sizes after thickening were 150.8 nm when no surfactant composition was used, 141.0 nm when the surfactant composition A was used, and 132.7 nm when the surfactant composition B was used.

Table 3 shows that, by thickening a resist pattern to be thickened according to the process of the present invention, namely by applying the surfactant composition onto the resist pattern to be thickened before applying the resist pattern thickening material to the resist pattern to be thickened, the resist pattern to be thickened can be thickened more than the case where no surfactant composition is applied. Thus, a fine hole pattern having a smaller aperture can be formed from the thickened resist pattern.

EXAMPLE 3

Figure 2A:
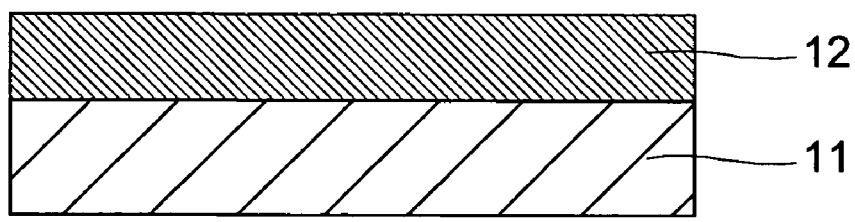
FIGS. 2A, 2B, 2C, 2D, 3A, 3B, 3C, 3D and 4 are schematic diagrams showing an example of a process for fabricating a semiconductor device having a multilayer wiring structure by the process of the present invention.
Figure 2B:
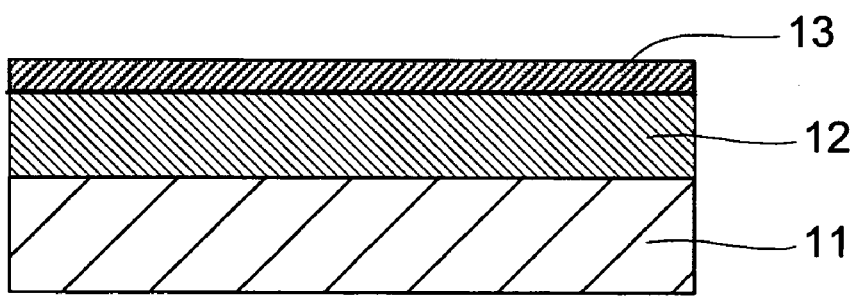
Figure 2C:
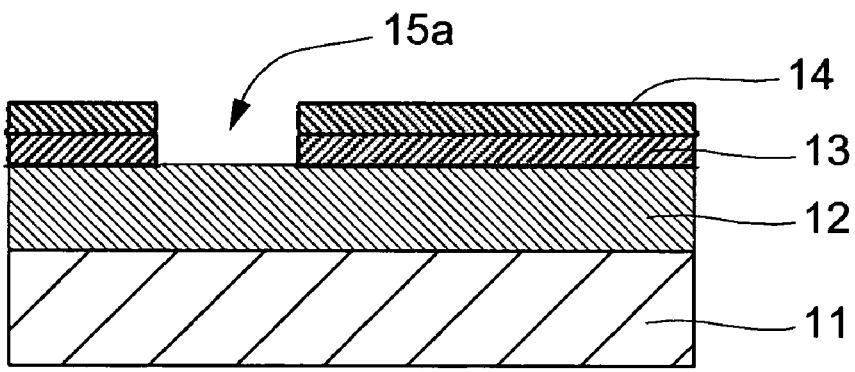
Figure 2D:
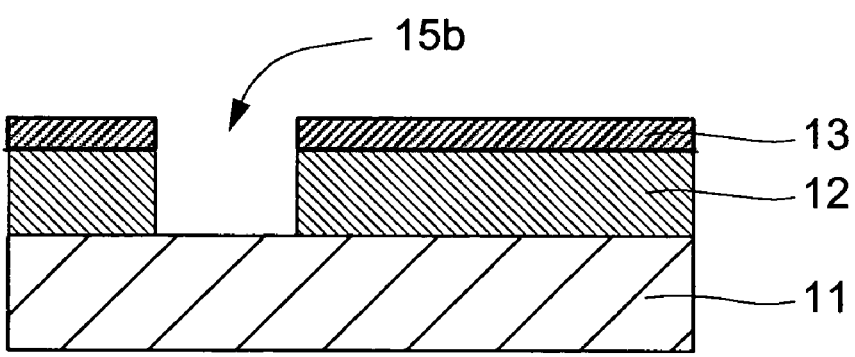

An interlayer dielectric 12 was formed on a silicon substrate 11 (FIG. 2A), and a titanium film 13 was formed on the interlayer dielectric 12 by sputtering (FIG. 2B). Next, a resist was patterned thereon to form a resist pattern 14, and the titanium film 13 was patterned by reactive ion etching using the resist pattern 14 as a mask to form an opening 15a (FIG. 2C). The resist pattern 14 was removed by reactive ion etching, and an opening 15b was formed in the interlayer dielectric 12 using the titanium film 13 as a mask (FIG. 2D).

Figure 3A:
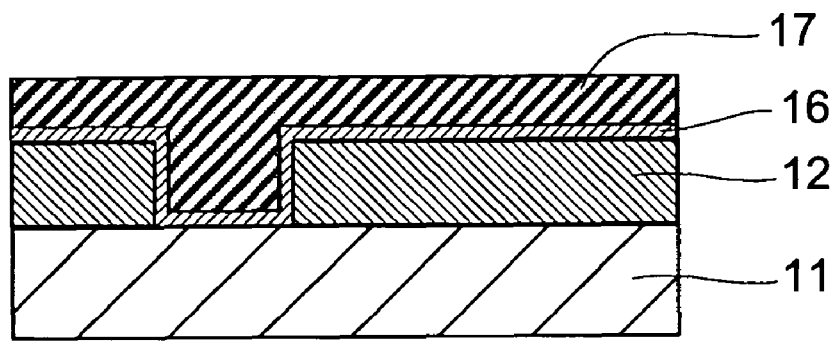
Figure 3B:
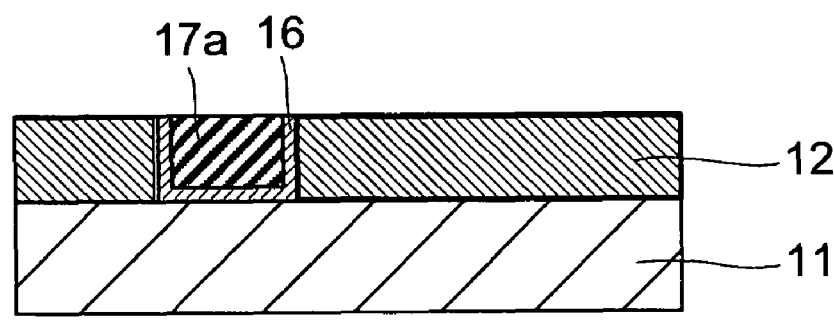

The titanium film 13 was removed by a wet process, a TiN film 16 was formed on the interlayer dielectric 12 by sputtering, and a Cu film 17 was formed on the TiN film 16 by electrolytic plating (FIG. 3A). The surface of the article was planarized (polished) by chemical-mechanical polishing (CMP) so that a barrier metal and Cu film (first metal film) remained only in a groove corresponding to the opening 15*b* (FIG. 1D) to thereby yield a first-layer wiring 17*a* (FIG. 3B).

Figure 3C:
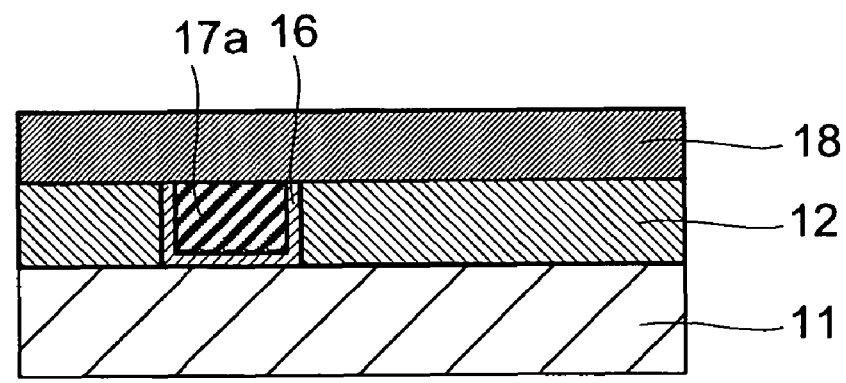
Figure 3D:
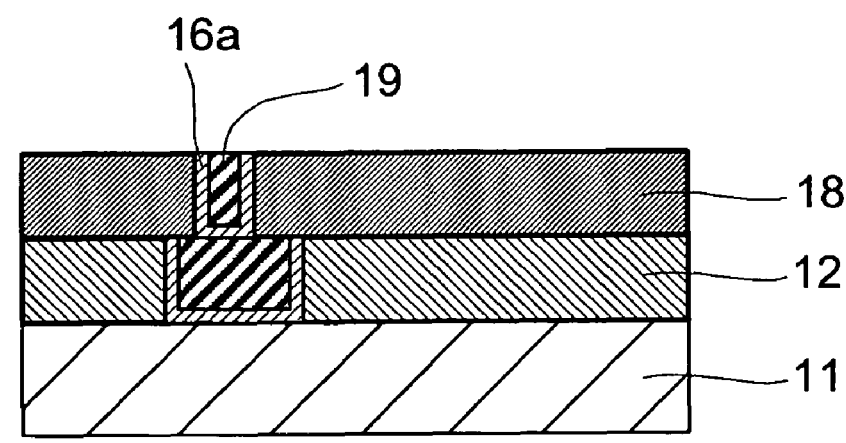

Next, an interlayer dielectric 18 was formed on the first-layer wiring 17*a* (FIG. 3C), and a Cu plug (second metal film) 19 was formed (FIG. 3D) by the procedures of FIGS. 2B, 2C, 2D, 3A, and 3B. The Cu plug 19 serves to connect between the first-layer wiring 17*a* and an upper layer wiring formed later.

Figure 4:
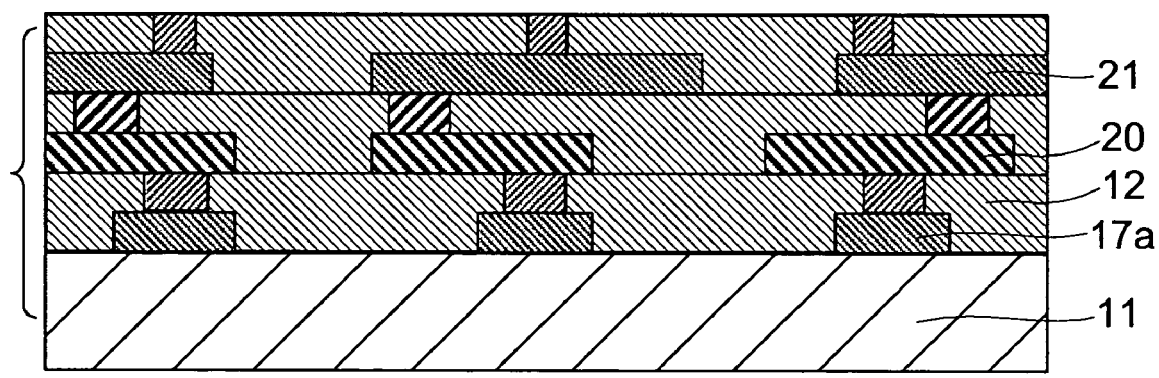

By repeating the above processes, a semiconductor device having a multilayer wiring structure including the first-layer wiring 17*a*, a second-layer wiring 20, and a third-layer wiring 21 on the silicon substrate 11 was manufactured (FIG. 4). In FIGS. 3A through 3D, barrier metal layers each formed under the individual wirings are not shown.

The resist pattern 14 in Example 3 is a fine resist pattern formed by the process of forming a resist pattern of the present invention, as in Example 1.

EXAMPLE 4

Flash Memory and Fabrication Thereof

Example 4 is an example of the semiconductor device and fabrication process thereof of the present invention using a resist pattern formed by the process of the present invention. In Example 4, resist films 26, 27, 29, 32 and 34 are resist patterns formed by the process of forming a resist pattern of the present invention as in Examples 1 and 2.

Figure 5A:
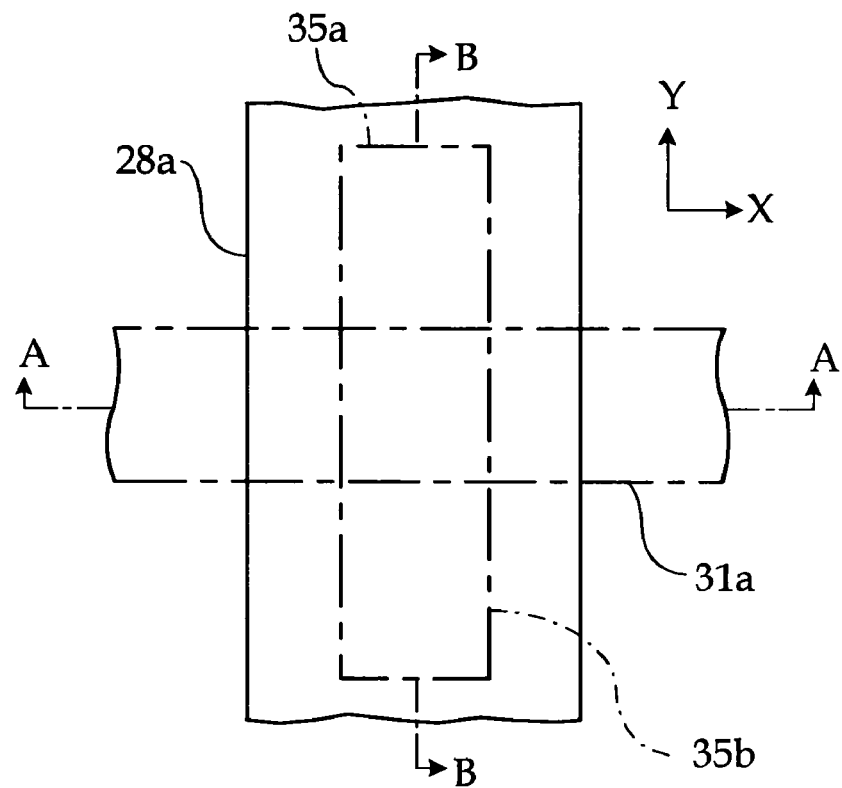
FIGS. 5A and 5B are top views of a flash EPROM as an example of the semiconductor device of the present invention.
Figure 5B:
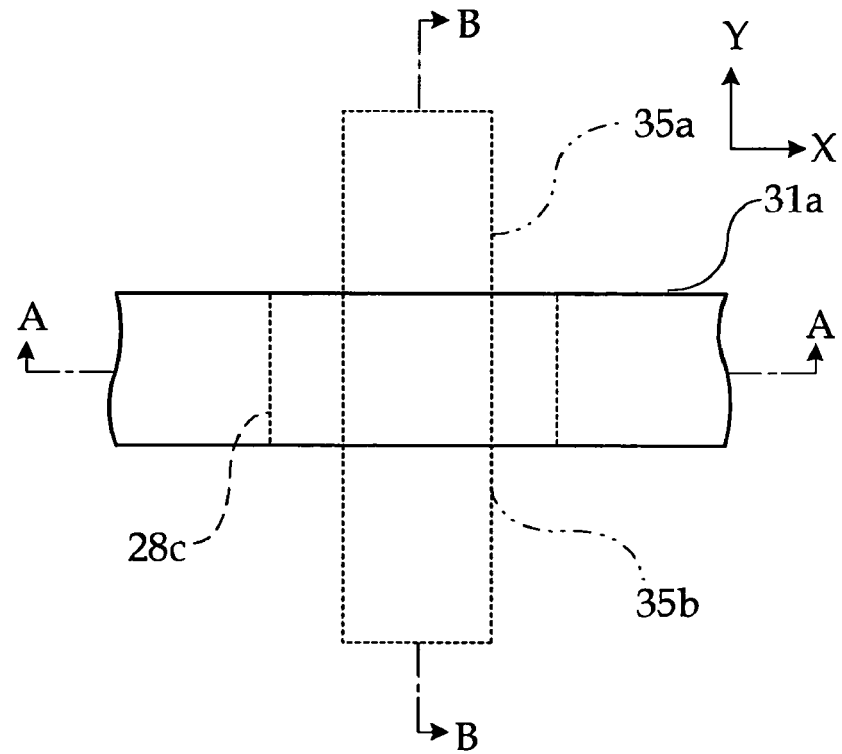

FIGS. 5A and 5B are top views (plan views) of a floating-gate tunnel oxide (FLOTOX) or EPROM tunnel oxide (ETOX) FLASH EPROM. FIGS. 6A, 6B, 6C, 7D, 7E, 7F, 8G, 8H, and 8I are schematic sectional views showing a fabrication process of the FLASH EPROM. In these figures, the left views are schematic sectional views (sectional views taken along lines A-A) in a gate width direction (in the X direction in FIG. 5A) of a memory cell unit (a first element region) in a portion in which a MOS transistor having a floating gate electrode is to be formed. The central views are schematic sectional views (sectional views taken along lines B-B) in a gate length direction (in the Y direction in FIG. 5A) of the memory cell unit in the same portion in the left views perpendicular to the X direction. The right views are schematic sectional views (sectional views taken along the line A-A in FIGS. 5A and 5B) of a portion on which a MOS transistor is to be formed in a peripheral circuit unit (a second element region).

First, as shown in FIG. 6A, a field oxide film 23 formed by a $SiO_2$ film was selectively formed at the element isolation region on a p-type Si substrate 22. Thereafter, a first gate dielectric 24*a* was formed at the MOS transistor of the memory cell portion (the first element region), by an $SiO_2$ film by thermal oxidation so as to become a thickness of 10 nm (100 Å) to 30 nm (300 Å). In a separate process, a second gate dielectric 24*b* was formed at the MOS transistor of the peripheral circuit portion (the second element region), by an $SiO_2$ film by thermal oxidation so as to become a thickness of 10 nm (100 Å) to 50 nm (500 Å). Note that, when the first gate dielectric 24*a* and the second gate dielectric 24*b* are the same thickness, these oxide films may be formed simultaneously in the same process. Next, in order to form a MOS transistor having depression type n-channels at the memory cell portion (the left side and the center in FIG. 6A), the peripheral circuit portion (the right side in FIG. 6A) was masked by the resist film 26 for the purpose of controlling the threshold voltage. Then, phosphorus (P) or arsenic (As) was introduced, as an n-type impurity in a dosage amount of $1\times10^{11}$ $cm^{-2}$ to $1\times10^{14}$ $cm^{-2}$ by an ion implantation method, into the regions which were to become the channel regions directly beneath the floating gate electrodes, so that a first threshold value control layer 25*a* was formed. Note that the dosage amount and the conductive type of the impurity at this time can be appropriately selected in accordance with whether depression type channels or accumulation type channels are to be formed.

Next, in order to form a MOS transistor having depression type n-channels at the peripheral circuit portion (the right side in FIG. 6B), the memory cell portion (the left side and the center in FIG. 6B) was masked by the resist film 27 for the purpose of controlling the threshold voltage. Then, phosphorus (P) or arsenic (As) was introduced, as an n-type impurity in a dosage amount of $1\times10^{11}$ $cm^{-2}$ to $1\times10^{14}$ $cm^{-2}$ by an ion implantation method, into the regions which were to become the channel regions directly beneath the gate electrodes, so that a second threshold value control layer 25*b* was formed.

Next, a first polysilicon film (a first conductor film) 28 having a thickness of 50 nm (500 Å) to 200 nm (2000 Å) was applied over the entire surface as a floating gate electrode of the MOS transistor at the memory cell portion (the left side and the center in FIG. 6C) and as a gate electrode of the MOS transistor at the peripheral circuit portion (the right side in FIG. 6C).

Figures 7D, 7E, 7F:
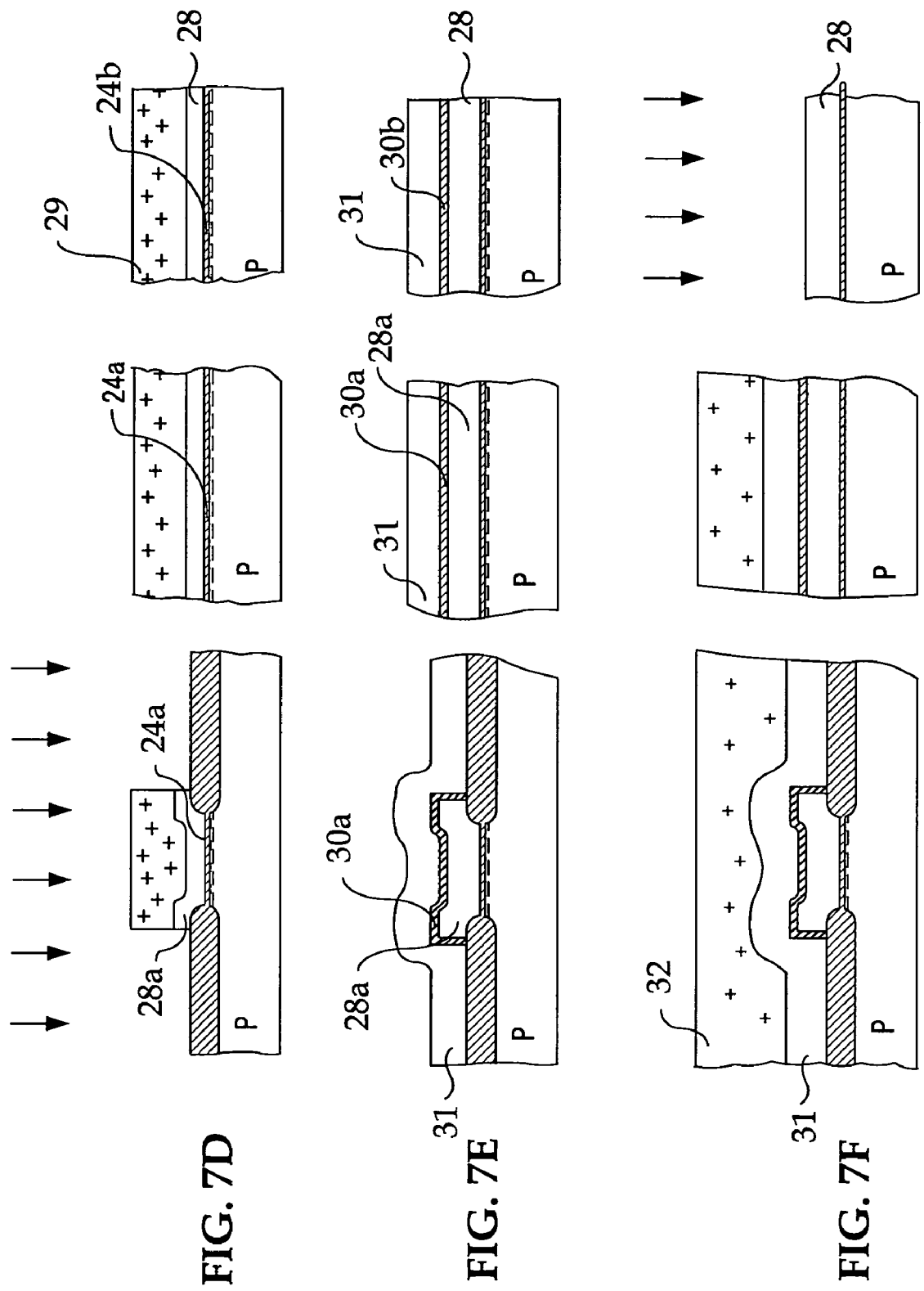

Thereafter, as shown in FIG. 7D, the first polysilicon film 28 was patterned by using the resist film 29 formed as a mask, so that a floating gate electrode 28*a* was formed at the MOS transistor at the memory cell portion (the left side and the center in FIG. 7D). At this time, as shown in FIG. 7D, in the X direction, patterning was carried out so as to obtain the final width, and in the Y direction, the region which was to become the S/D region layer remained covered by the resist film 29 without patterning.

Next, as shown in the left side and the center of FIG. 7E, after the resist film 29 was removed, a capacitor dielectric 30*a* formed of a $SiO_2$ film was formed by thermal oxidation to a thickness of approximately of 20 nm (200 Å) to 50 nm (500 Å) so as to cover the floating gate electrode 28*a*. At this time, a capacitor dielectric 30*b* formed of a $SiO_2$ film was formed on the first polysilicon film 28 of the peripheral circuit portion (the right side in FIG. 7E). Here, although the capacitor dielectrics 30*a* and 30*b* were formed only by $SiO_2$ films, they may be formed by a composite film of two to three layers of $SiO_2$ and $Si_3N_4$ films.

Next, as shown in FIG. 7E, a second polysilicon film (a second conductor film) 31, which was to become a control gate electrode, was formed to a thickness of 50 nm (500 Å) to 200 nm (2000 Å) so as to cover the floating gate electrode 28*a* and the capacitor dielectric 30*a*.

Then, as shown in FIG. 7F, the memory portion (the left side and the center of FIG. 7F) was masked by the resist film 32, and the second polysilicon film 31 and the capacitor dielectric 30*b* of the peripheral circuit portion (the right side in FIG. 7F) were successively removed by etching so that the first polysilicon film 28 was exposed at the surface.

Subsequently, as shown in FIG. 8G, the second polysilicon film 31, the capacitor dielectric 30*a* and the first polysilicon film 28*a* which had been patterned only in the X direction, of the memory portion (the left side and the center of FIG. 8G), were, by using the resist film 32 as a mask, subjected to patterning in the Y direction so as to become the final dimension of a first gate portion 33*a*. A laminate structure formed by a control gate electrode 31*a*/a capacitor dielectric 30*c*/a floating gate electrode 28*c*, which had a width of approximately 1 μm in the Y direction, was formed. The first polysilicon film 28 of the peripheral circuit portion (the left side in FIG. 8G) was, by using the resist film 32 as a mask, subjected to patterning so as to become the final dimension of a second gate portion 33b, and a gate electrode 28b of a width of approximately 1 µm was formed.

Next, by using the laminate structure formed by the control gate electrode 31a/the capacitor dielectric 30c/the floating gate electrode 28c of the memory cell portion (the left side and the center of FIG. 8H) as a mask, phosphorus (P) or arsenic (As) was introduced, in a dosage amount of $1\times10^{14}$ cm$^{-2}$ to $1\times10^{16}$ cm$^{-2}$ by an ion implantation method, into the Si substrate 22 of the element forming region, so that n type S/D region layers 35a and 35b were formed. By using the gate electrode 28b at the peripheral circuit portion (the right side of FIG. 8H) as a mask, phosphorus (P) or arsenic (As) was introduced, as an n type impurity in a dosage amount of $1\times10^{14}$ cm$^{-2}$ to $1\times10^{16}$ cm$^{-2}$ by an ion implantation method, into the Si substrate 22 of the element forming region, so that S/D region layers 36a and 36b were formed.

Subsequently, the first gate portion 33a of the memory cell portion (the left side and the center of FIG. 8I) and the second gate portion 33b of the peripheral circuit portion (the right side of FIG. 8I) were covered by forming an interlayer dielectric 37 formed of a PSG film to a thickness of about 500 nm (5000 Å).

Thereafter, contact holes 38a, 38b and contact holes 39a, 39b were formed in the interlayer dielectric 37 formed on the S/D region layers 35a, 35b and the S/D region layers 36a, 36b. Then, S/D electrodes 40a, 40b and S/D electrodes 41a, 41b were formed.

In this way, as shown in FIG. 8I, the FLASH EPROM was manufactured as a semiconductor device.

In this FLASH EPROM, the second gate dielectric 24b of the peripheral circuit portion (the right side in FIGS. 6A through 8I) is covered (refer to the right side in FIGS. 6C through 8I) by the first polysilicon film 28 or the gate electrode 28b always after formation. Thus, the second gate dielectric 24b is maintained at the thickness at which it was initially formed. Thus, it is easy to control the thickness of the second gate dielectric 24b, and easy to adjust the concentration of the conductive impurity in order to control the threshold voltage.

Note that, in the above-described example, in order to form the first gate portion 33a, first, patterning is carried out at a predetermined width in the gate widthwise direction (the X direction in FIGS. 5A and 5B), and thereafter, patterning is carried out in the gate lengthwise direction (the Y direction in FIGS. 5A and 5B) so as to attain the final predetermined width. However, conversely, patterning may be carried out at a predetermined width in the gate lengthwise direction (the Y direction in FIGS. 5A and 5B), and thereafter, patterning may be carried out in the gate widthwise direction (the X direction in FIGS. 5A and 5B) so as to attain the final predetermined width.

The example of manufacturing a FLASH EPROM shown in FIGS. 9A through 9C is the same as the above-described example, except that the processes after the process shown by FIG. 7F in the above example are changed to the processes shown in FIGS. 9A through 9C. Namely, as shown in FIG. 9A, this example differs from the above-described example only with respect to the point that a polycide film is provided by forming a high melting point metal film (a fourth conductor film) 42 formed of a tungsten (W) film or a titanium (Ti) film to a thickness of approximately 200 nm (2000 Å), on the second polysilicon film 31 of the memory cell portion shown at the left side and the center of FIG. 9A and on the first polysilicon film 28 of the peripheral circuit portion shown at the right side in FIG. 9A. The processes after FIG. 9A, namely, the processes shown in FIGS. 9B and 9C, are the same as those shown in FIGS. 8G through 8I. Explanation of the processes which are the same as those shown in FIGS. 8G through 8I is omitted. In FIGS. 9A through 9C, portions which are the same as those in FIGS. 8G through 8I are denoted by the same reference numerals.

In this way, as shown in FIG. 9C, the FLASH EPROM was manufactured as a semiconductor device.

In this FLASH EPROM, high melting point metal films (the fourth conductor films) 42a and 42b were formed on the control gate electrode 31a and the gate electrode 28b. Thus, the electrical resistance value could be decreased even more.

Note that, here, the high melting point metal films (the fourth conductor films) 42a and 42b were used as the high melting point metal film (the fourth conductor film). However, a high melting point metal silicide film such as a titanium silicide (TiSi) film or the like may be used.

The example of manufacturing a FLASH EPROM shown in FIGS. 10A through 10C is the same as the above-described example, except that a second gate portion 33c of the peripheral circuit portion (the second element region) (the right side in FIG. 10A) also has the structure of the first polysilicon film 28b (first conductor film)/an SiO$_2$ film 30d (capacitor dielectric)/a second polysilicon film 31b (second conductor film) in the same way as the first gate portion 33a of the memory cell portion (the first element region) (the left side and center in FIG. 10A), and that the first polysilicon film 28b and the second polysilicon film 31b are short-circuited so as to form a gate electrode as shown in FIG. 10B or FIG. 10C.

Here, as shown in FIG. 10B, an opening 52a, which passes through the first polysilicon film 28b (first conductor film)/the SiO$_2$ film 30d (capacitor dielectric)/the second polysilicon film 31b (second conductor film), is formed at a different place than, for example, a second gate portion 33c shown in FIG. 10A, and is formed on such as an dielectric 54. A third conductive film, for example, a high melting point metal film 53a such as a W film or a Ti film or the like, is filled in the opening 52a. The first polysilicon film 28b and the second polysilicon film 31b are thereby short-circuited. Or, as shown in FIG. 10C, an opening 52b, which passes through the first polysilicon film 28b (first conductor film)/the SiO$_2$ film 30d (capacitor dielectric), is formed. The first polysilicon film 28b, the lower layer, is exposed at the bottom portion of the opening 52b. Thereafter, a third conductive film, for example, a high melting point metal film 53b such as a W film or a Ti film or the like, is filled in the opening 52b. The first polysilicon film 28b and the second polysilicon film 31b are thereby short-circuited.

In this FLASH EPROM, the second gate portion 33c of the peripheral circuit portion and the first gate portion 33a of the memory cell portion have the same structure. Thus, the peripheral circuit portion can be formed simultaneously with the formation of the memory cell portion. The manufacturing process can thereby be simplified, which is efficient.

Note that, here, the third conductor film 53a or 53b was formed separately from the high melting point metal film (the fourth conductor film) 42. However, they may be formed simultaneously as a common high melting point metal film.

EXAMPLE 5

Fabrication of Recording Head

Example 5 relates to the fabrication of a recording head (magnetic head) as an application embodiment of the process for forming a resist pattern of the present invention. In Example 5, the following resist patterns 102 and 126 are of resist patterns formed by the process of the present invention.

FIGS. 11A, 11B, 11C, and 11D show processes for the fabrication of the magnetic head.

Figure 11A:
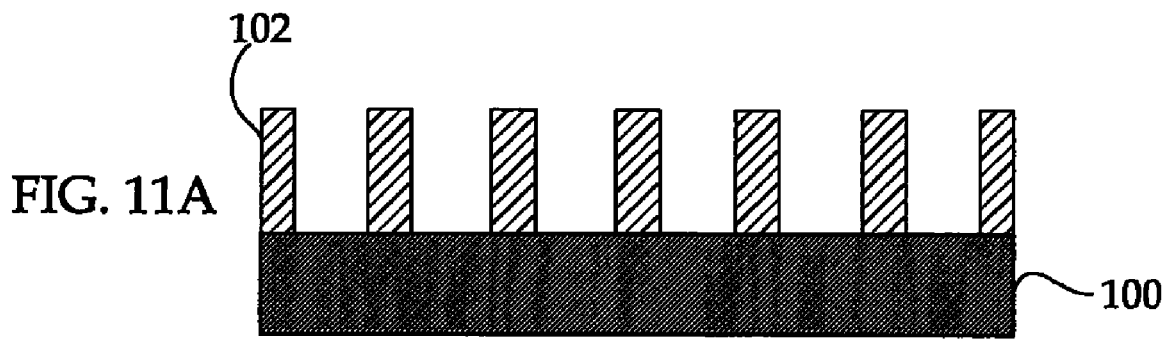
FIGS. 11A, 11B, 11C, and 11D are schematic sectional views showing an example of fabrication of a magnetic head using a fine resist pattern formed by the process of the present invention.

First, as shown in FIG. 11A, a resist film was formed to a thickness of 6 µm on an interlayer dielectric 100. Exposure and development were carried out, so as to form the resist pattern 102 having an opening pattern for formation of a spiral, thin film magnetic coil.

Figure 11B:
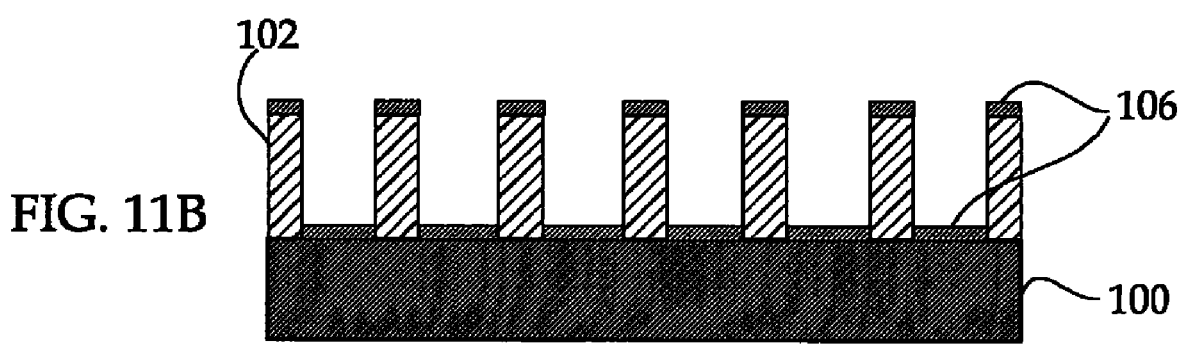

Next, as shown in FIG. 11B, a plating underlying layer 106 was formed by vapor deposition on the interlayer dielectric 100, both on the resist pattern 102 and on the regions where the resist pattern 102 was not formed, namely, the exposed surfaces of openings 104. The plating underlying layer 106 was a laminate of a Ti adhering film having a thickness of 0.01 µm and a Cu adhering film having a thickness of 0.05 µm.

Figure 11C:
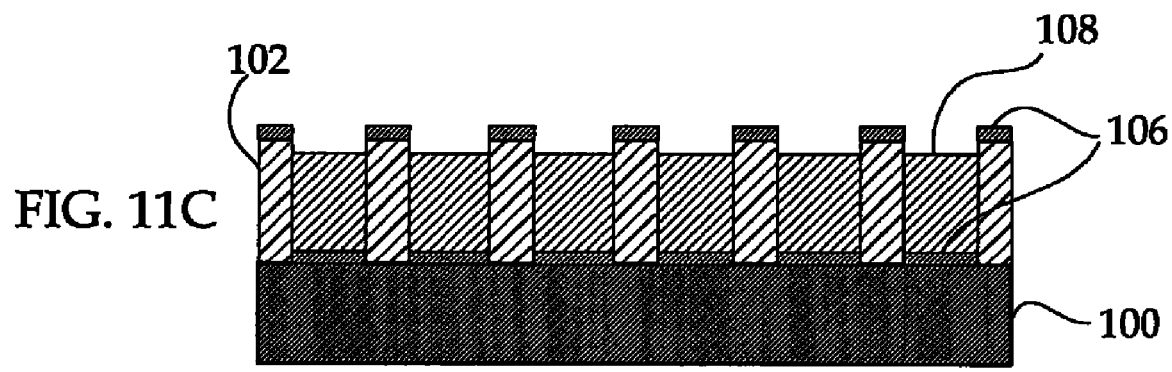

Next, as shown in FIG. 11C, a thin film conductor 108, which was formed by a Cu plating film of a thickness of 3 µm, was formed on the interlayer insulating layer 100, at the regions where the resist pattern 102 was not formed, namely, on the surfaces of the plating underlying layer 106 formed on the exposed surfaces of the openings 104.

Figure 11D:
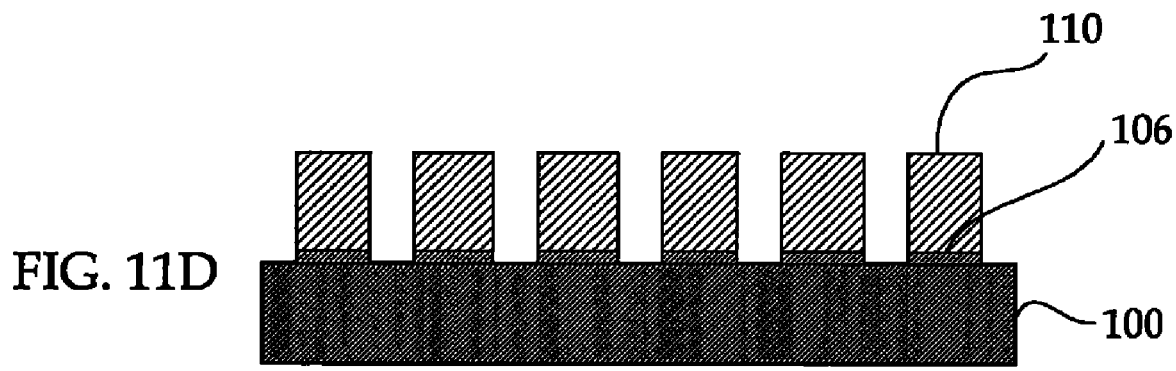

Then, as shown in FIG. 11D, when the resist pattern 102 was dissolved and removed and lifted off from the interlayer insulating layer 100, a thin film magnetic coil 110, which was formed by the spiral pattern of the thin film conductor 108, was formed.

The recording head was thereby manufactured.

At the obtained recording head, the spiral pattern was formed to be fine by the resist pattern 102 which was thickened by using the resist pattern thickening material of the present invention. Thus, the thin film magnetic coil 110 was fine and detailed, and was extremely well suited to mass production.

Another recording head was fabricated by processes shown in FIGS. 12 through 17.

Figure 12:
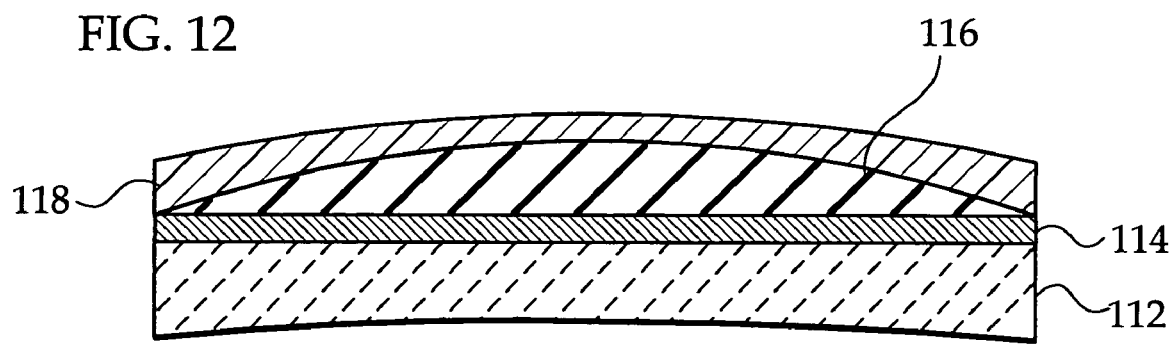
FIGS. 12 to 17 are schematic sectional views showing another example of fabrication of a magnetic head using a fine resist pattern formed by the process of the present invention.

As shown in FIG. 12, a gap layer 114 was formed by a sputtering method to cover a non-magnetic substrate 112 formed of ceramic. Note that an insulator layer (not illustrated) formed of silicon oxide and a conductive underlying layer (not illustrated) formed of an Ni—Fe permalloy were formed in advance by a sputtering method to cover the non-magnetic substrate 112, and a lower portion magnetic layer (not illustrated) formed of an Ni—Fe permalloy was formed on the non-magnetic substrate 112. Then, a resin insulating film 116, which was formed by a thermosetting resin, was formed on predetermined regions on the gap layer 114, except for the portions which were to become the magnetic distal end portions of the aforementioned unillustrated lower portion magnetic layer. Next, a resist material was applied on the resin insulating film 116 so as to form a resist film 118.

Figure 13:
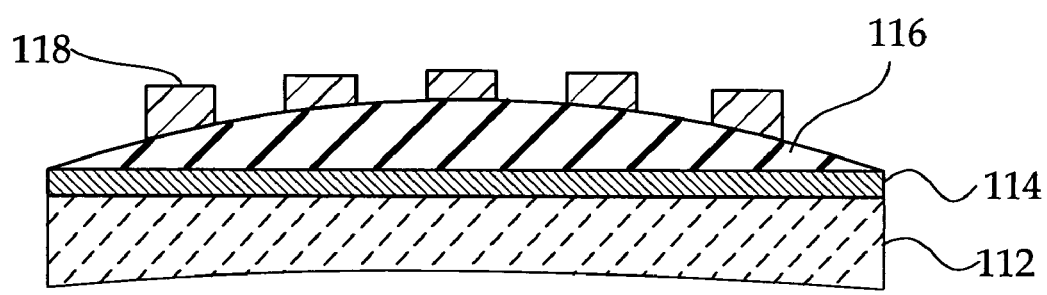
Figure 14:
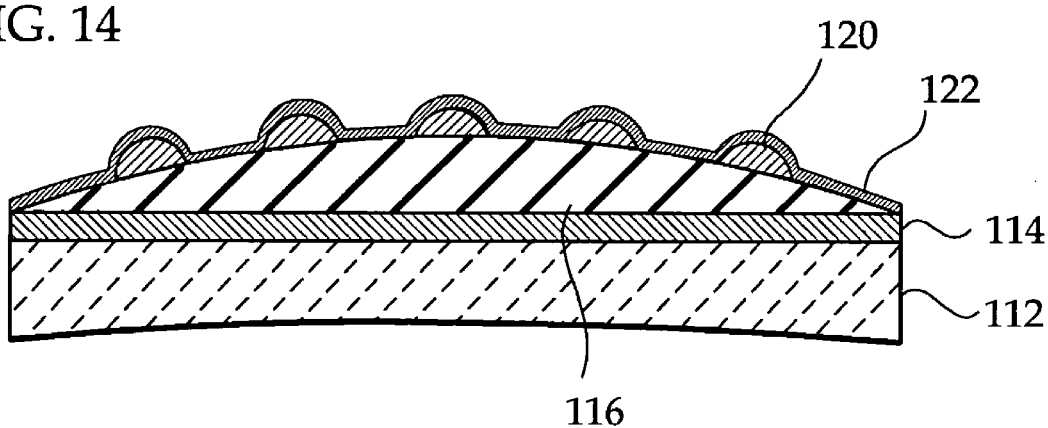

Then, as shown in FIG. 13, the resist film 118 was exposed and developed, so that a spiral pattern was formed. Subsequently, as shown in FIG. 14, the resist film 118 of the spiral pattern was subjected to thermosetting processing for about one hour at a temperature of several hundred degrees Celsius, so that a first spiral pattern 120, which was shaped as projections, was formed. Then, a conductive underlying layer 122 formed of Cu was formed to cover the surface of the first spiral pattern 120.

Figure 15:
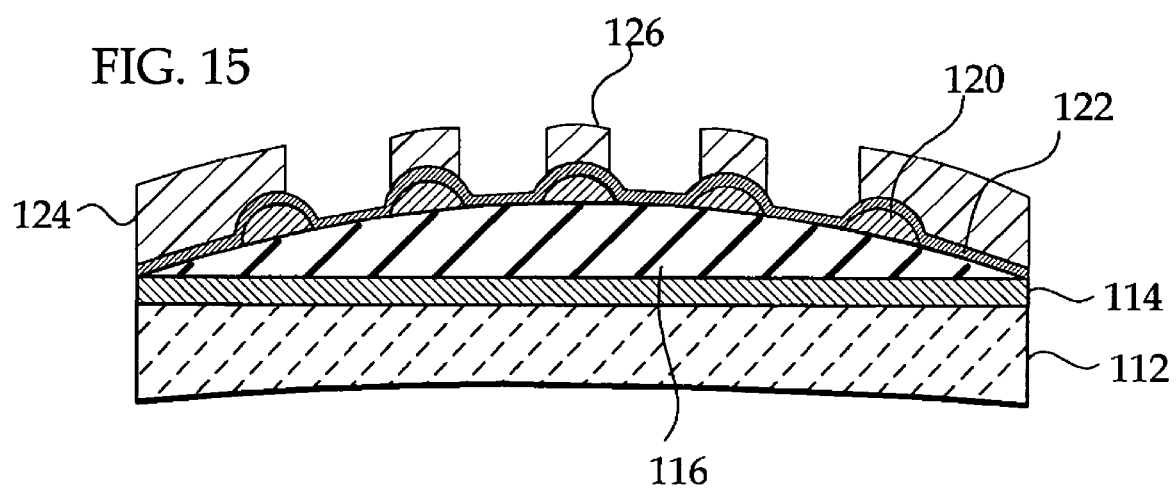

Next, as shown in FIG. 15, a resist material was applied on the conductive underlying layer 122 by a spin coating method so as to form a resist film 124. Thereafter, the resist film 124 was patterned on the first spiral pattern 120, so that the resist pattern 126 was formed.

Figure 16:
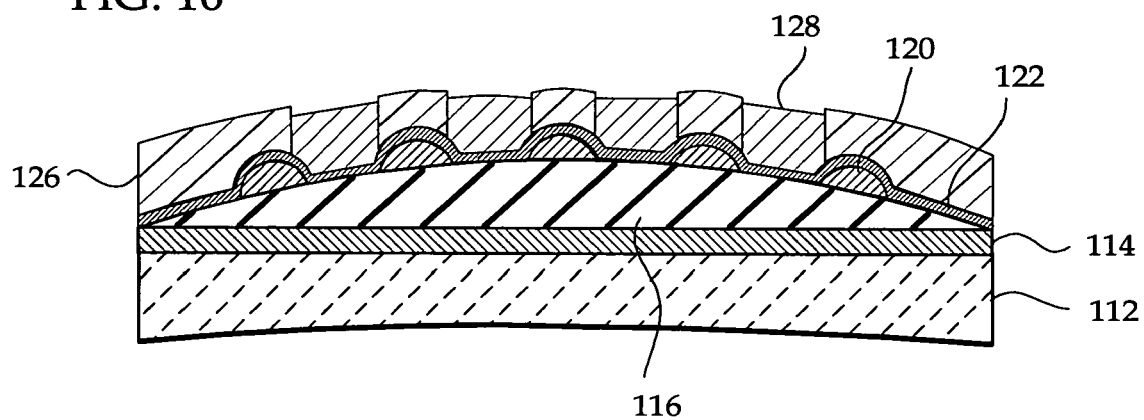
Figure 17:
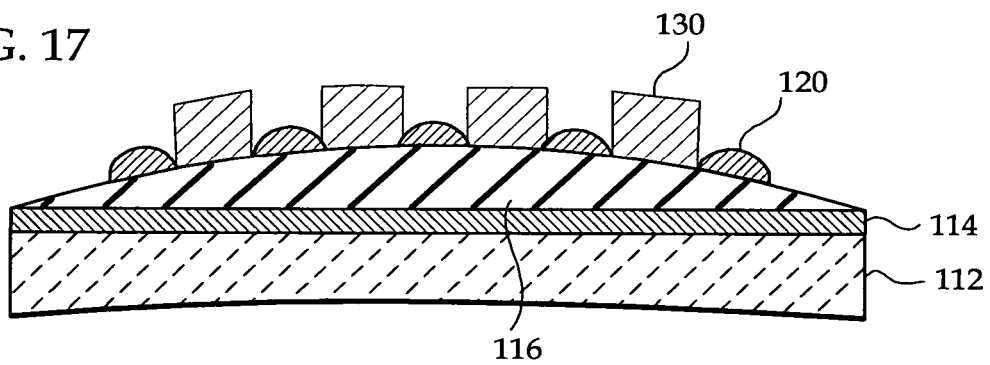

Then, as shown in FIG. 16, a Cu conductor layer 128 was formed by a plating method on the exposed surface of the conductive underlying layer 122, namely, at the regions where the resist pattern 126 was not formed. Thereafter, as shown in FIG. 17, by melting and removing the resist pattern 126, the resist pattern 126 was lifted-off from the conductive underlying layer 122, so that a spiral, thin film magnetic coil 130 formed of the Cu conductor layer 128 was formed.

Figure 18:
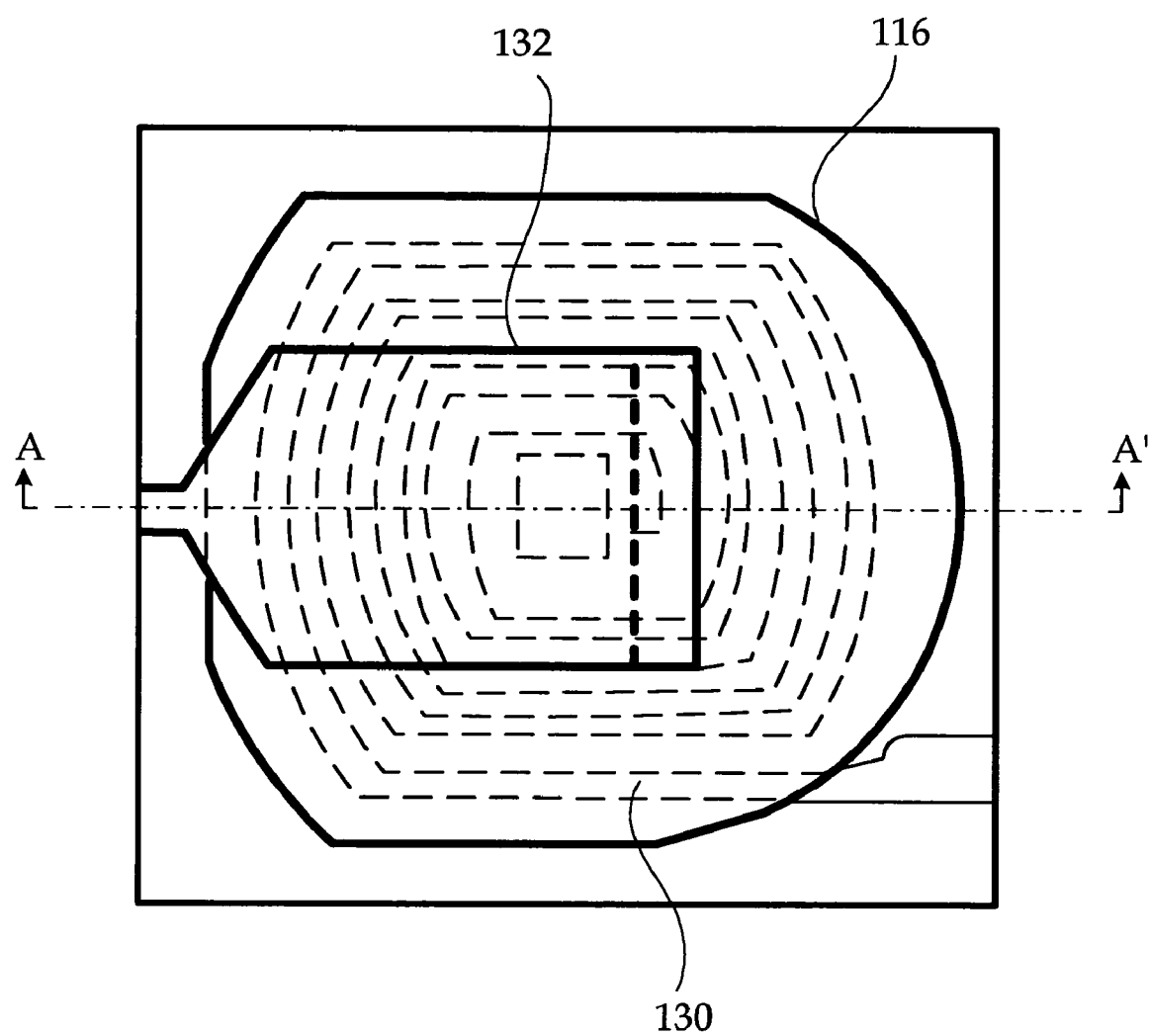
FIG. 18 is a plan view of an example of a magnetic head fabricated by the process shown in FIGS. 12 to 17.

In this way, a recording head, such as that shown in plan view in FIG. 18, was manufactured which had a magnetic layer 132 on the resin insulating film 116 and had the thin film magnetic coil 130 on the surface.

At the obtained recording head, the spiral pattern was formed to be fine by the resist pattern 126 which was thickened by using the resist pattern thickening material of the present invention. Therefore, the thin film magnetic coil 130 was fine and detailed, and was extremely well suited to mass production.

The present invention can provide a process for forming a resist pattern by thickening a resist pattern to be thickened which is formed of, for example, an ArF resist to thereby easily form a fine resist space pattern (a resist pattern having a narrowed pitch) exceeding exposure limit of optical source of conventional exposure devices; a high-performance semiconductor device having a fine pattern formed by using the resist pattern having a narrowed pitch which is formed by the above process; and an efficient process for fabricating the semiconductor device.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A process for forming a resist pattern, comprising:
   forming a resist pattern to be thickened on an underlying object;
   applying a surfactant composition consisting of a first surfactant and a solvent on the resist pattern to be thickened; and
   applying a resist pattern thickening material comprising at least a resin and a second surfactant on the resist pattern to be thickened;
   wherein the first surfactant contained in the surfactant composition is a metal-free surfactant; and
   wherein the metal-free surfactant is a nonionic surfactant.

2. A process for forming a resist pattern according to claim 1, further comprising heating the resist pattern to be thickened after applying the surfactant composition and before applying the resist pattern thickening material.

3. A process for forming a resist pattern according to claim 2, wherein the resist pattern to be thickened is heated at 70° C. to 150°C.

4. A process for forming a resist pattern according to claim 1, wherein the resist pattern to be thickened does not dissolve in the solvent in the surfactant composition.

5. A process for forming a resist pattern according to claim 4, wherein the solvent is water.

6. A process for forming a resist pattern according to claim 1, wherein the second surfactant contained in the resist pattern thickening material is a metal-free surfactant.

7. A process for forming a resist pattern according to claim 1, wherein the resist pattern thickening material is soluble in at least one of water and alkalis.

8. A process for forming a resist pattern according to claim 1, wherein the resist pattern thickening material further comprises a crosslinking agent.

9. A process for forming a resist pattern according to claim 8, wherein the crosslinking agent is at least one selected from the group consisting of melamine derivatives, urea derivatives, and uril derivatives.

10. A process for forming a resist pattern according to claim 1, wherein the resin contained in the resist pattern thickening material is at least one selected from the group consisting of poly(vinyl alcohol)s, poly(vinyl acetal)s, poly(vinyl acetate)s, poly(acrylic acid)s, and polyvinylpyrrolidinones.

11. A process for forming a resist pattern according to claim 1, wherein the resist pattern thickening material further comprises an organic solvent.

12. A process for forming a resist pattern according to claim 11, wherein the organic solvent is at least one selected from the group consisting of alcohol solvents, chain ester solvents, cyclic ester solvents, ketone solvents, chain ether solvents, and cyclic ether solvents.

13. A process for forming a resist pattern according to claim 1, further comprising developing the resist pattern thickening material after applying the resist pattern thickening material.

14. A process for forming a resist pattern according to claim 13, wherein pure water is used for developing the resist pattern thickening material.

15. A process for forming a resist pattern according to claim 1, wherein the resist pattern to be thickened is formed with an ArF resist.

16. A process for forming a resist pattern according to claim 15, wherein the ArF resist is at least one selected from the group consisting of acrylic resists having an alicyclic functional group in its side chain, cycloolefin-maleic anhydride resists, and cycloolefin resists.

17. A process for fabricating a semiconductor device, comprising:
   forming a resist pattern to be thickened on an underlying object;
   applying a surfactant composition consisting of a first surfactant and a solvent on the resist pattern to be thickened;
   applying a resist pattern thickening material comprising at least a resin and a second surfactant on the resist pattern to be thickened so as to form a thickened resist pattern; and
   patterning the underlying object by performing an etching using the thickened resist pattern as a mask;
   wherein the first surfactant contained in the surfactant composition is a metal-free surfactant; and
   wherein the metal-free surfactant is a nonionic surfactant.

18. A process for forming a resist pattern, comprising:
   forming a resist pattern to be thickened on an underlying object;
   applying a surfactant composition consisting of a first surfactant and a solvent on the resist pattern to be thickened;
   applying a resist pattern thickening material comprising at least a resin and a second surfactant on the resist pattern to be thickened; and
   prebaking the resist pattern applied with the resist pattern thickening material;
   wherein the first surfactant contained in the surfactant composition is a metal-free surfactant; and
   wherein the metal-free surfactant is a nonionic surfactant.

* * * * *